(12) United States Patent
Jarek et al.

(10) Patent No.: US 8,137,891 B2
(45) Date of Patent: Mar. 20, 2012

(54) BAKEABLE LITHOGRAPHIC PRINTING PLATES WITH A HIGH RESISTANCE TO CHEMICALS

(75) Inventors: Mathias Jarek, Northeim (DE); Monika Brummer, Badenhausen (DE)

(73) Assignee: Eastman Kodak Company, Rochester, NY (US)

( * ) Notice: Subject to any disclaimer, the term of this patent is extended or adjusted under 35 U.S.C. 154(b) by 696 days.

(21) Appl. No.: 12/297,058

(22) PCT Filed: Apr. 12, 2007

(86) PCT No.: PCT/EP2007/003271
§ 371 (c)(1),
(2), (4) Date: Oct. 14, 2008

(87) PCT Pub. No.: WO2007/121871
PCT Pub. Date: Nov. 1, 2007

(65) Prior Publication Data
US 2009/0269554 A1      Oct. 29, 2009

(30) Foreign Application Priority Data

Apr. 25, 2006   (EP) .................................... 06008510

(51) Int. Cl.
*G03F 7/004* (2006.01)
(52) U.S. Cl. .................. 430/270.1; 430/271.1; 430/910
(58) Field of Classification Search ............... 430/270.1, 430/300, 302, 906, 901, 271.1, 908, 910, 430/944
See application file for complete search history.

(56) References Cited

U.S. PATENT DOCUMENTS

| 4,551,410 A | 11/1985 | Tomiyama et al. ........... 430/215 |
| 4,626,497 A * | 12/1986 | Roth et al. ..................... 430/293 |
| 6,593,055 B2 * | 7/2003 | Shimazu et al. .............. 430/166 |
| 6,803,438 B1 | 10/2004 | Brocchini et al. ......... 526/292.1 |
| 6,969,579 B1 | 11/2005 | Kitson et al. ............... 430/270.1 |
| 2003/0091933 A1* | 5/2003 | Kunita ........................ 430/283.1 |
| 2003/0194632 A1 | 10/2003 | Ray et al. ....................... 430/160 |
| 2006/0034807 A1 | 2/2006 | Griffith ........................ 424/93.7 |
| 2006/0040205 A1* | 2/2006 | Kawauchi et al. .......... 430/270.1 |
| 2006/0210917 A1* | 9/2006 | Ray et al. .................... 430/270.1 |

FOREIGN PATENT DOCUMENTS

EP      1 522 417      4/2005

OTHER PUBLICATIONS

A.F. Shaaban et al.; "Binary copolymerizations of N-acryloxyphthalimide", ACTA Polymerica, vol. 40, No. 7, Jul. 1989 pp. 445-448.

* cited by examiner

*Primary Examiner* — Anca Eoff
(74) *Attorney, Agent, or Firm* — J Lanny Tucker

(57) ABSTRACT

A singe- or multilayer lithographic printing plate precursor comprises on a substrate a radiation-sensitive coating that comprises a copolymer soluble or dispersible in aqueous alkaline solution and comprising (meth)acryl recurring units, imide recurring units, and amide recurring units derived from corresponding ethylenically unsaturated polymerizable monomers; the copolymer provides increased chemical resistance for the lithographic printing plate precursors which can be negatively or positively working.

16 Claims, No Drawings

BAKEABLE LITHOGRAPHIC PRINTING PLATES WITH A HIGH RESISTANCE TO CHEMICALS

The present invention relates to lithographic printing plate precursors, with a high resistance to chemicals and developers whose coating is furthermore bakeable so that the resistance to chemicals and abrasion can be increased even more. The invention also relates to processes for the production and imaging of such precursors, as well as radiation-sensitive compositions for producing such precursors.

Lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor (in this context, the term printing plate precursor refers to a coated printing plate prior to exposure and developing) comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure.

In conventional plates, a film containing the information to be transferred is attached to the printing plate precursor under vacuum in order to guarantee good contact. The plate is then exposed by means of a radiation source, part of which is comprised of UV radiation. When a positive plate is used, the area on the film corresponding to the image on the plate is so opaque that the light does not affect the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

For several decades, positive working commercial printing plate precursors were characterized by the use of alkali-soluble phenolic resins and naphthoquinone diazide derivatives; imaging was carried out by means of UV radiation.

Recent developments in the field of lithographic printing plate precursors have led to radiation-sensitive compositions suitable for the production of printing plate precursors which can be addressed directly by lasers. The digital image-forming information can be used to convey an image onto a printing plate precursor without the use of a film, as is common in conventional plates.

In the past few years, concentrated efforts have been made to develop heat-sensitive printing plate precursors (often also referred to as "thermoplates"). Here, imaging is carried out by the direct application of heat or by radiation (such as IR radiation) which is converted to heat by a light-heat converter (e.g. IR absorber).

One example of a positive working, direct laser addressable printing plate precursor is described in U.S. Pat. No. 4,708,925. The patent describes a lithographic printing plate precursor whose imaging layer comprises a phenolic resin and a radiation-sensitive onium salt. As described in the patent, the interaction between the phenolic resin and the onium salt results in an alkali insolubility of the composition, which restores the alkali solubility by photolytic decomposition of the onium salt. The printing plate precursor can be used as a precursor of a positive working printing plate or as a precursor of a negative printing plate, if additional process steps are added between exposure and developing, as described in detail in British patent no. 2,082,339.

Another example of a direct laser addressable printing plate precursor that can be used as a positive working system is described in U.S. Pat. No. 5,372,907 and U.S. Pat. No. 5,491,046. These two patents describe the decomposition of a latent Bronsted acid by radiation in order to increase solubility of the resin matrix upon image-wise exposure. As in the case of the printing plate precursor described in U.S. Pat. No. 4,708,925, these systems can also be used as negative working systems in combination with additional process steps between imaging and developing. In the case of the negative working printing plate precursors, the decomposition by-products are subsequently used to catalyze a cross-linking reaction between the resins in order to render the layer of the irradiated areas insoluble, which requires a heating step prior to developing.

EP-A-0 823 327 describes IR-sensitive printing plate precursors whose radiation-sensitive layer comprises, in addition to an IR absorber and a polymer such as for example novolak, a substance that decreases the solubility of the composition in an alkaline developer. Amongst others, sulfonic acid esters, phosphoric acid esters, aromatic carboxylic acid esters, carboxylic acid anhydrides, aromatic ketones and aldehydes, aromatic amines and aromatic ethers are mentioned as such "insolubilizers". These printing plate precursors show a high degree of IR sensitivity and do not require additional steps between exposure and developing; furthermore, they can be handled under normal lighting conditions (daylight with a certain portion of UV radiation), i.e. they do not require yellow light. However, the resistance of the developed printing plates to press room chemicals (fountain solution, organic solvents in printing inks, washing solutions etc.) is unsatisfactory.

WO 99/21725 discloses IR-sensitive positive working printing plate precursors whose heat-sensitive layer comprises a substance that improves the resistance of the non-heated areas to an attack by the alkaline developer; this substance is selected from compounds with polyalkylene oxide units, siloxanes, as well as esters, ethers and amides of polyhydric alcohols. These printing plate precursors as well are characterized by a high degree of IR sensitivity and can be handled in normal daylight. Here as well, an improved resistance to press room chemicals would be desirable. For printing applications involving large numbers of copies, a baking step is recommended.

WO 2005/016645 describes heat-sensitive elements wherein a ($C_4$-$C_{20}$-alkyl)phenol novolak is used instead of the siloxanes described in WO 99/21725.

In EP-A-1 101 607, IR-sensitive elements are described whose IR-sensitive coatings additionally comprise a carboxylic acid derivative of a cellulose polymer. The use of this acidic cellulose polymer resulted in an improved resistance of the coating to organic solvents, which are e.g. contained in some printing inks, fountain solutions and washing solutions, so that the printing plates yielded higher numbers of copies. However, further improvement would be desirable.

U.S. Pat. No. 6,294,311 B1, U.S. Pat. No. 6,358,669 B1 and U.S. Pat. No. 6,555,291 B1 each describe dual-layer heat-sensitive dual-layer printing plate precursors; however, an improved resistance to chemicals and abrasion resistance would be desirable.

In recent years, offset printing plates have had to meet ever growing demands for resistance to solvents and common press room chemicals such as plate cleansers or blanket washing solutions and alcohol substitutes in the fountain solution. In particular when printing with UV-curing inks, where washing solutions with a high ester, ether or ketone content are used, the chemical resistance of conventional plates, especially IR-sensitive positive working plates, is no longer sufficient unless they are subjected to special stabilizing processes.

Thus, despite extensive research in the field of chemically resistant binders for offset printing plates, the current technology still has room for improvement, in particular with respect to binders that can be employed more flexibly.

It is therefore the object of the present invention to provide lithographic printing plate precursors, whose radiation-sensitive coating has a high degree of chemical resistance without substantially affecting radiation sensitivity. It would furthermore be advantageous if the coating is bakeable since baking usually leads to a further increase in the resistance to chemicals and an increase in abrasion resistance.

This object is achieved by a lithographic printing plate precursor (in the following also referred to as "radiation-sensitive element") comprising a substrate with a hydrophilic surface and a single- or multi-layer radiation-sensitive coating comprising a copolymer (CP) comprising the (meth)acryl unit A, the imide unit B and the amide unit C, wherein unit A has the following formula

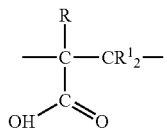

(A)

the imide unit B has the following formula

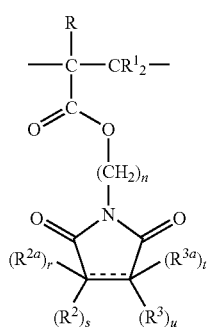

(B)

and the unit C is at least one unit selected from

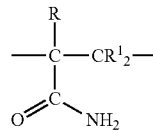

(C-1)

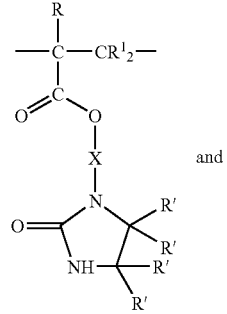

(C-2)

and

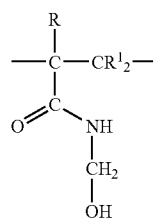

(C-3)

wherein
each R and each $R^1$ is independently selected from hydrogen, alkyl, aryl, halogen and —CN,
X is a spacer,
each R' is independently selected from hydrogen, alkyl and aryl,
n is 0 or 1 and
$R^{2a}$, $R^2$, $R^{3a}$ and $R^3$ are independently selected from hydrogen and alkyl, or
$R^2$ and $R^3$ or $R^{2a}$ and $R^{3a}$, together with the two C-atoms to which they are bonded, form an aryl group, a heteroaryl group or an unsaturated or saturated carbocyclic or heterocyclic group;
r, s, t and u are each 0 or 1, with the proviso that one of r and s is 0 if the C-atom to which $R^2$ and $R^{2a}$ are bonded is part of a C—C double bond, and with the proviso that one of t and u is 0 if the C-atom to which $R^3$ and $R^{3a}$ are bonded is part of a C—C double bond;
and the dotted line indicates a double bond which may or may not be present.

Unless defined otherwise, the term "alkyl" as used in the present invention refers to a straight-chain or branched saturated hydrocarbon group preferably comprising 1 to 18 carbon atoms, especially preferred 1 to 10 carbon atoms and most preferred 1 to 6 carbon atoms. The alkyl group can optionally comprise one or more substituents (preferably 0 or 1 substituent) selected for example from halogen atoms (fluorine, chlorine, bromine, iodine), CN, $NO_2$, $NR'_2$, COOR' and OR' (R' independently represents a hydrogen atom, or an alkyl group).

Unless defined otherwise, a saturated carbocyclic group should comprise 5 to 10 ring carbon atoms. Bridged, saturated cyclic hydrocarbons, such as e.g. bicyclic hydrocarbons (a norbornane group would be an example thereof) should be encompassed as well, wherein the bridge can also comprise a heteroatom selected from O, S and N. The carbocyclic group can optionally comprise one or more substituents, e.g. selected from alkyl groups, halogen atoms, —OR', —$NR'_2$ and CN(R' independently represents a hydrogen atom or an alkyl group). If one or more (preferably 1 or 2) ring carbon atoms are replaced with heteroatoms selected from O, S and NR' (R' is hydrogen or alkyl), the group is referred to as a saturated heterocyclic group. If the carbocyclic group contains one or more double bonds without forming an aromatic ring system, it is referred to as an unsaturated carbocyclic group; in this case as well, bridged systems (wherein the bridge optionally comprises a heteroatom selected from O, S and N), such as e.g. a norbornene group, should be encompassed. If a heterocyclic group contains one or more double bonds without forming an aromatic ring system, it is referred to as an unsaturated heterocyclic group; here as well, bridged systems optionally comprising a heteroatom selected from O, S and N in the bridge should be encompassed. Unsaturated carbocyclic groups and saturated and unsaturated heterocyclic groups can optionally comprise one or more substituents, e.g. selected from those mentioned in connection with saturated carbocyclic groups.

Unless defined otherwise, the term "aryl" as used in the present invention refers to an aromatic carbocyclic group with one or more fused rings, which preferably comprises 5 to 14 carbon atoms. The aryl group can optionally comprise one or more substituents (preferably 0 to 3) selected for example from halogen atoms, alkyl groups, alkoxy groups, CN, $NO_2$, $NR'_2$, COOR' and OR' (wherein each R' is independently selected from hydrogen and alkyl). Preferred examples include a phenyl group and a naphthyl group which can optionally be substituted.

A heteroaryl group as referred to in the present invention is an aryl group wherein at least 1 (preferably 1 to 3) ring carbon atom is replaced with a heteroatom selected from O, S and N (preferably N); substituents include those mentioned above in connection with aryl.

A fused ring or ring system as referred to in the present invention is a ring that shares two atoms with the ring to which it is fused; e.g. naphthalene.

According to the present invention, a coating can consist of one layer or of several layers applied one after the other. It is also possible that only one coating solution is applied but that due to separation processes during drying two layers are formed. A coating comprising several layers is considered "radiation-sensitive" if at least one of the layers is radiation-sensitive.

Copolymer

CP

The copolymer used in the present invention comprises a (meth)acryl unit A, an imide unit B and an amide unit C selected from (C-1), (C-2) and (C-3):

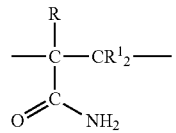
(A)

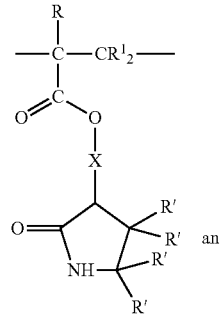
(B)

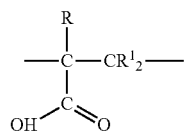
(C-1)

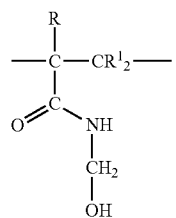
(C-2)

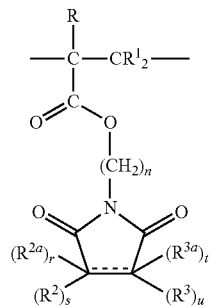
(C-3)

wherein
each R and each $R^1$ is independently selected from hydrogen, alkyl, aryl, halogen and —CN,
X is a spacer,
each R' is independently selected from hydrogen, alkyl and aryl,
n is 0 or 1 and
$R^{2a}$, $R^2$, $R^{3a}$ and $R^3$ are independently selected from hydrogen and alkyl, or
$R^2$ and $R^3$ or $R^{2a}$ and $R^{3a}$, together with the two C-atoms to which they are bonded, form an aryl group, a heteroaryl group or an unsaturated or saturated carbocyclic or heterocyclic group;
r, s, t and u are each 0 or 1, with the proviso that one of r and s is 0 if the C-atom to which $R^2$ and $R^{2a}$ are bonded is part of a C—C double bond, and with the proviso that one of t and u is 0 if the C-atom to which $R^3$ and $R^{3a}$ are bonded is part of a C—C double bond;
and the dotted line indicates a double bond which may or may not be present.

R is preferably hydrogen or an optionally substituted alkyl group, especially preferred hydrogen or a methyl group, and particularly preferred a methyl group.

Each $R^1$ is preferably independently an optionally substituted alkyl group or hydrogen and especially preferred hydrogen.

n is preferably 0.

Preferably, $R^2$ and $R^3$ or $R^{2a}$ and $R^{3a}$, together with the two C-atoms to which they are bonded, form an aryl group (especially preferred an optionally substituted phenyl group) or an unsaturated or saturated carbocyclic group (preferably with 6 ring atoms). It is especially preferred that the carbocyclic group be monounsaturated and it optionally comprises a bridge optionally containing an O-atom; —$CH_2$— and —O— are preferred bridges. If the carbocyclic ring is monounsaturated, the C-atoms to which $R^2$, $R^{2a}$, $R^3$ and $R^{3a}$ are bonded are preferably not part of the C—C double bond.

If $R^2$ and $R^3$ form a ring, $R^{2a}$ and $R^{3a}$ are preferably both hydrogen; if $R^{2a}$ and $R^{3a}$ form a ring, $R^2$ and $R^3$ are preferably both hydrogen.

If the C-atoms to which $R^2$, $R^{2a}$, $R^3$ and $R^{3a}$ are bonded are not part of a C—C double bond, preferably one of $R^2$ and $R^{2a}$ and one of $R^3$ and $R^{3a}$ is a hydrogen atom.

In the unit of formula (C-2), each R' independently represents hydrogen or an optionally substituted alkyl group; preferably no or only one group R' is different from hydrogen.

X is preferably selected from alkylene, arylene, an optionally unsaturated heterocyclic group, an optionally unsaturated carbocyclic group, a heteroaryl group (wherein each of the above groups is optionally mono- or polysubstituted), a group of formula (1)

—[CH$_2$—CH$_2$O]$_z$—CH$_2$—CH$_2$—    (1), a group of formula (2)

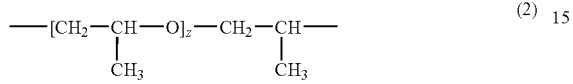

and a group of formula (3)

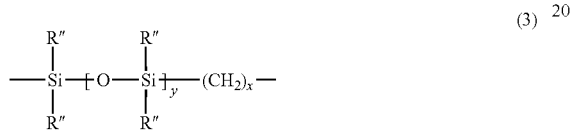

wherein z and y independently represent 0 or an integer from 1 to 20, x is an integer from 1 to 20 and each R'' is independently selected from alkyl and aryl; the divalent group of formula (2) can be bonded to the oxygen atom of the carboxy group either via the —CH$_2$— end or the —CH(CH$_3$)— end, while the divalent group of formula (3) can only be bonded to the oxygen atom of the carboxy group via the Si atom.

It is especially preferred that X be an alkylene or arylene group, in particular an alkylene group.

It is especially preferred that unit A has the following formula (A'):

wherein R is as defined above and preferably represents hydrogen or methyl.

It is especially preferred that unit B has the following formula (B')

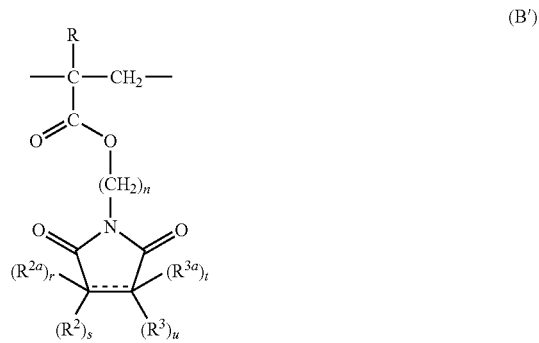

wherein R is as defined above and preferably represents hydrogen or methyl and $R^2$, $R^{2a}$, $R^3$, $R^{3a}$, n, r, s, t and u are as defined above.

It is especially preferred that unit C is at least one of formulas (C-1'), (C-2') and (C-3')

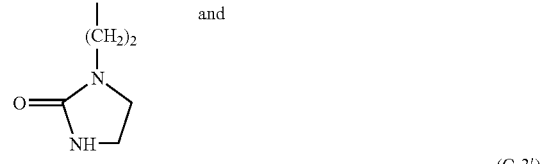

wherein R is as defined above and preferably represents hydrogen or methyl.

The monomer unit A is preferably present in the copolymer of the present invention in an amount of 1 to 98 wt.-%, based on the copolymer, more preferred 5 to 60 wt.-%, especially preferred 20 to 40 wt.-%.

Unit B is preferably present in an amount of 1 to 98 wt.-%, based on the copolymer, more preferred 10 to 90 wt.-%, especially preferred 20 to 80 wt.-%.

Unit C is preferably present in an amount of 1 to 98 wt.-%, based on the copolymer, more preferred 5 to 60 wt.-%, especially preferred 20 to 40 wt.-%.

The weight-average molecular weight of the copolymer (determined by means of GPC) is preferably 1,000 to 1,000,000, especially preferred 5,000 to 250,000.

The copolymer can be prepared by means of common polymerization processes (e.g. solution polymerization, mass polymerization, emulsion and suspension polymerizations) from the monomers M-A and M-B as well as a monomer M-C selected from M-C-1, M-C-2 and M-C-3,

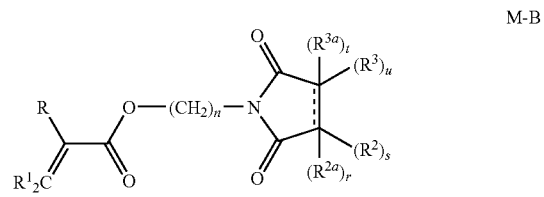

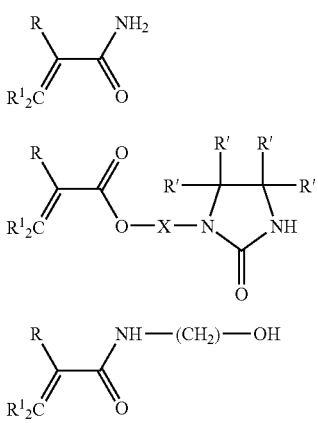

wherein R, $R^1$, $R^2$, $R^3$, $R^{2a}$, $R^{3a}$, R', X, n, r, s, t and u are as defined for A, B and C, and optionally further monomers. Preferably, a solution containing the monomers M-A, M-B and M-C is heated and a common initiator is added. It is also possible to add the initiator to the monomer mixture, then add an organic solvent and subsequently heat the resulting solution.

Methacrylic acid is an especially preferred monomer M-A.

Especially preferred monomers M-B are those with an N—O bond (i.e. n=0); the following are particularly preferred:

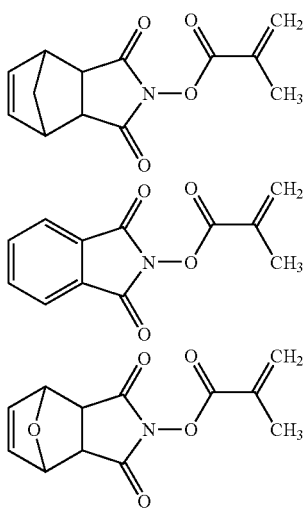

Another preferred monomer M-B is:

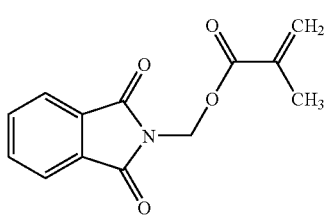

Especially preferred monomers M-C are those wherein R represents —$CH_3$.

In addition to the units (A), (B) and (C), copolymers CP can also comprise other structural units. The amount of optional structural units is preferably 0 to 80 wt.-%, based on the copolymer, more preferred no more than 50 wt.-% and especially preferred no more than 35 wt.-%. According to a preferred embodiment, no further structural units are present in the copolymer in addition to units (A), (B) and (C). Optional structural units are for example those derived from styrene and substituted styrenes, (meth)acrylates, allyl compounds and the like.

Copolymers CP can be used as binders for UV/VIS sensitive (250 to 750 nm, preferably 300 to 450 nm) elements and for IR-sensitive (more than 750 to 1,200 nm, preferably 800 to 1,100 nm) elements. They can be used both in positive working and in negative working elements. They are preferably used in IR-sensitive elements, and particularly preferred in positive working IR-sensitive elements since those often exhibit the problem of a low resistance to chemicals. Copolymers CP furthermore have the advantage that they are bakeable.

Lithographic Printing Plate Precursors

The precursors of lithographic printing plates comprise a substrate with a hydrophilic surface and a radiation-sensitive coating applied thereon.

Substrates

The substrate used for the radiation-sensitive precursor is preferably a dimensionally stable plate or foil-shaped material. In the production of printing plate precursors, a dimensionally stable plate or foil-shaped material can be used that has already been used as a substrate for printing matter. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability, is inexpensive and furthermore exhibits excellent adhesion to the radiation-sensitive coating. Furthermore, a composite film can be used wherein an aluminum foil has been laminated onto a plastic film, such as e.g. a polyethylene terephthalate film, or paper, or a plastic film onto which aluminum has been applied by means of vapor deposition.

A metal substrate, in particular an aluminum substrate, is preferably subjected to a surface treatment, for example graining by brushing in a dry state or brushing with abrasive suspensions, or electrochemical graining, e.g. by means of a hydrochloric acid electrolyte or $HNO_3$, and optionally anodizing, e.g. in sulfuric acid or phosphoric acid.

An aluminum foil which preferably has a thickness of 0.1 to 0.7 mm, more preferred 0.15 to 0.5 mm, is an especially preferred substrate. It is preferred that the foil be grained (preferably electrochemically) and then show an average roughness of 0.2 to 1 μm, especially preferred 0.3 to 0.8 μm.

According to an especially preferred embodiment, the grained aluminum foil was furthermore anodized. The layer weight of the resulting aluminum oxide is preferably 1.5 to 5 $g/m^2$, especially preferred 2 to 4 $g/m^2$.

Furthermore, in order to improve the hydrophilic properties of the surface of the metal substrate that has been grained and optionally anodized, the metal substrate can be subjected to an aftertreatment with an aqueous solution of e.g. sodium silicate, calcium zirconium fluoride, polyvinylphosphonic acid or phosphoric acid.

The details of the above-mentioned substrate treatment are well known to the person skilled in the art.

Negative Working Radiation-Sensitive Elements

Negative working coatings are described in numerous references, e.g. UV-sensitive coatings on the basis of negative diazo resins are described in EP 0 752 430 B1, photopolymer layers sensitive to 405 nm are described in DE 103 07 451, photopolymer layers sensitive to VIS are described in EP 0 684 522 B1 and IR-sensitive polymerizable systems are described in DE 199 06 823 2.

Photopolymerization

UV/VIS and IR

One type of negative working coating applied onto a substrate comprises (a) at least one absorber component selected from photoinitiators and sensitizer/coinitiator systems which absorbs radiation of a wavelength in the range of 250 to 1,200 nm and is capable of initiating a free-radical polymerization and (b) a free-radical polymerizable monomer, oligomer and/or prepolymer; in such coatings, the novel copolymers can be used as the sole polymeric binder or together with other binders.

Absorber Component

The radiation-sensitive coating furthermore comprises at least one absorber component selected from photoinitiators and sensitizer/coinitiator systems.

The absorber component is selected such that it is capable of significant absorption in the range in which the radiation source to be used later on during imaging emits; preferably, the absorber shows an absorption maximum in that range. Thus, if the radiation-sensitive element is e.g. going to be imaged by means of an IR laser, the absorber should essentially absorb radiation in the range of about 750 to 1,200 nm and preferably show an absorption maximum in that range. On the other hand, if imaging is to be carried out by means of UV/VIS radiation, the absorber should essentially absorb radiation in the range of about 250 to 750 nm and preferably show an absorption maximum in that range. Suitable photoinitiators and/or sensitizers are known to the person skilled in the art, or it can easily be determined whether significant absorption occurs in the desired wave length range by means of simple tests (e.g. recording an absorption spectrum).

In the present invention, a photoinitiator is a compound capable of absorbing radiation when exposed and of forming free radicals by itself, i.e. without the addition of coinitiators. Examples of suitable photoinitiators absorbing UV or VIS radiation include triazine derivatives with 1 to 3 $CX_3$ groups (wherein every X is independently selected from a chlorine or bromine atom, and is preferably a chlorine atom), hexaarylbisimidazole compounds, benzoin ethers, benzil ketals, oxime ethers, oxime esters, α-hydroxy- or α-amino-acetophenones, acylphosphines, acylphosphine oxides, acylphosphine sulfides, metallocenes, peroxides etc. Examples of suitable triazine derivatives include 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, and 2-(4-ethoxy-naphtho-1-yl)-4,6-bis(trichloromethyl)-s-triazine and 2-[4-(2-ethoxyethyl)-naphtho-1-yl]-4,6-bis(trichloro-methyl)-s-triazine. Suitable oxime ethers and oxime esters are for example those derived from benzoin. Preferred metallocenes are for example titanocenes with two five-membered cyclodienyl groups such as e.g. cyclopentadienyl groups and one or two six-membered aromatic groups having at least one ortho-fluorine atom and optionally also one pyrryl group; most preferred metallocenes are bis(cyclopentadienyl)-bis-[2,6-difluoro-3-(pyrr-1-yl)-phenyl]titanium and dicyclopentadiene-bis-2,4,6-trifluorophenyl-titanium or zirconium.

In the present invention, a single photoinitiator or a mixture of two or more can be used.

The photoinitiators can be used alone or in combination with one or more coinitiators; the addition of coinitiators can increase the effectiveness of the photoinitiation.

The amount of photoinitiator(s) is not particularly restricted; however, if photoinitiators are present, it is preferably in the range of 0.2 to 25 wt.-%, based on the dry layer weight, especially preferred 0.5 to 15 wt.-%.

A sensitizer as referred to in the present invention is a compound which can absorb radiation when it is exposed but which cannot by itself, i.e. without the addition of coinitiators, form free radicals.

All light-absorbing compounds that are photooxidizable or photoreducible or capable of transferring their excitation energy to receptor molecules are suitable sensitizers for use in the present invention. Examples of such dyes include cyanine dyes, merocyanine dyes, oxonol dyes, diarylmethane dyes, triarylmethane dyes, xanthene dyes, coumarin derivatives, ketocoumarin dyes, acridine dyes, phenazine dyes, quinoxaline dyes, pyrrylium dyes or thiapyrrylium dyes, azaanulene dyes (such as phthalocyanines and porphyrines), indigo dyes, anthraquinone dyes, polyarylenes, polyarylpolyenes, 2,5-diphenylisobenzofuranes, 2,5-diarylfuranes, 2,5-diarylthiofuranes, 2,5-diarylpyrroles, 2,5-diarylcyclopentadienes, polyarylphenylenes, polyaryl-2-pyrazolines, carbonyl compounds such as aromatic ketones or quinones, e.g. benzophenone derivatives, Michler's ketone, thioxanthone derivatives, anthraquinone derivatives and fluorenone derivatives.

Coumarin sensitizers of formula (1) are for example suitable for the UV range of the electromagnetic spectrum:

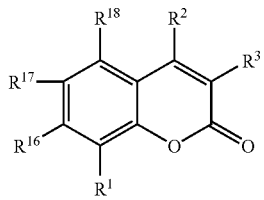
(I)

wherein
$R^1$, $R^{16}$, $R^{17}$ and $R^{18}$ are independently selected from —H, a halogen atom, $C_1$-$C_{20}$ alkyl, —OH, —$R^4$ and —$NR^5R^6$, wherein $R^4$ is $C_1$-$C_{20}$ alkyl, $C_5$-$C_{10}$ aryl or $C_6$-$C_{30}$ aralkyl (preferably $C_1$-$C_6$ alkyl) and $R^5$ and $R^6$ are independently selected from a hydrogen atom and $C_1$-$C_{20}$ alkyl,
or $R^1$ and $R^{16}$, $R^{16}$ and $R^{17}$ or $R^{17}$ and $R^{18}$ together form a 5- or 6-membered heterocyclic ring with a heteroatom, selected from N and O, in one or both positions adjacent to the phenyl ring shown in formula (1),
or $R^{16}$ or $R^{17}$ forms, together with its two adjacent substituents, a 5- or 6-membered heterocyclic ring with a heteroatom, selected from N and O, in one or both positions adjacent to the phenyl ring shown in formula (1),
wherein each formed 5- or 6-membered heterocyclic ring can independently be substituted with one or more $C_1$-$C_6$ alkyl groups,
with the proviso that at least one of $R^1$, $R^{16}$, $R^{17}$ and $R^{18}$ is different from hydrogen and $C_1$-$C_{20}$ alkyl,
$R^2$ is a hydrogen atom, $C_1$-$C_{20}$ alkyl, $C_5$-$C_{10}$ aryl or $C_6$-$C_{30}$ aralkyl and
$R^3$ is a hydrogen atom or a substituent selected from —COOH, —$COOR^7$, —$COR^8$, —$CONR^9R^{10}$, —CN, $C_5$-$C_{10}$ aryl, $C_6$-$C_{30}$ aralkyl, a 5- or 6-membered heterocyclic optionally benzofused group, a group —CH=CH—$R^{12}$ and

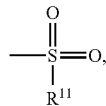

wherein $R^7$ is $C_1$-$C_{20}$ alkyl, $R^8$ is $C_1$-$C_{20}$ alkyl or a 5- or 6-membered heterocyclic group, $R^9$ and $R^{10}$ are independently selected from a hydrogen atom and $C_1$-$C_{20}$ alkyl, $R^{11}$ is $C_1$-$C_{12}$ alkyl or alkenyl, a heterocyclic non-aromatic ring or $C_5$-$C_{20}$ aryl optionally with a heteroatom, selected from O, S and N, and $R^{12}$ is $C_5$-$C_{10}$ aryl or a 5- or 6-membered heterocyclic, optionally aromatic, ring;
or $R^2$ and $R^3$, together with the carbon atoms to which they are bonded, form a 5- or 6-membered, optionally aromatic, ring.
They are described in more detail e.g. in WO 2004/049068 A1.
Furthermore, bisoxazole derivatives and analogues of the formula (II) are suitable for the UV range

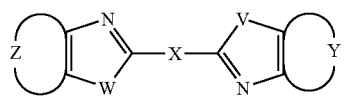
(II)

wherein X is a spacer group comprising at least one C—C double bond conjugated to the heterocycles,
Y and Z independently represent an optionally substituted fused aromatic ring and
V and W are independently selected from O, S and NR, wherein R is an alkyl, aryl or aralkyl group which can optionally be mono- or polysubstituted, as described in more detail in WO 2004/074929 A2, and oxazole compounds of the formula (III)

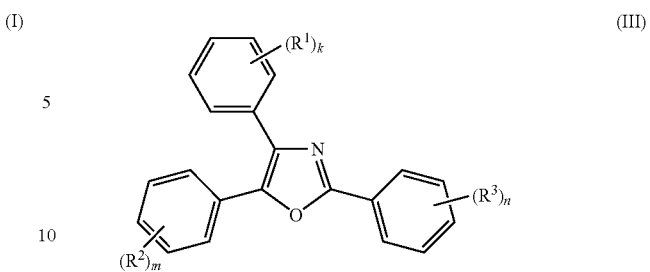
(III)

wherein each $R^1$, $R^2$ and $R^3$ is independently selected from a halogen atom, an optionally substituted alkyl group, an optionally substituted aryl group, which may also be fused, an optionally substituted aralkyl group, a group —$NR^4R^5$ and a group —$OR^6$,
wherein $R^4$ and $R^5$ are independently selected from a hydrogen atom, an alkyl, aryl or aralkyl group,
$R^6$ is an optionally substituted alkyl, aryl or aralkyl group or a hydrogen atom, and k, m and n are independently 0 or an integer from 1 to 5, as described in detail in WO 2004/074930 A2.
The 1,4-dihydropyridine compounds of formula (IV) as described in WO 2004/111731 A1 are an example of another class of sensitizers suitable for the UV range

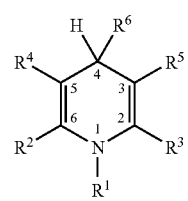
(IV)

wherein
$R^1$ is selected from a hydrogen atom, —C(O)$OR^7$, an optionally substituted alkyl group, an optionally substituted aryl group and an optionally substituted aralkyl group,
$R^2$ and $R^3$ are independently selected from optionally substituted alkyl groups, optionally substituted aryl groups, CN and a hydrogen atom,
$R^4$ and $R^5$ are independently selected from —C(O)$OR^7$, —C(O)$R^7$, —C(O)$NR^8R^9$ and CN,
or $R^2$ and $R^4$ together form an optionally substituted phenyl ring or a 5- to 7-membered carbocyclic or heterocyclic ring, wherein the unit

is present in the carbocyclic or heterocyclic ring adjacent to position 5 of the dihydropyridine ring and wherein the carbocyclic or heterocyclic ring optionally comprises additional substituents,
or both $R^2$ and $R^4$ as well as $R^3$ and $R^5$ form either optionally substituted phenyl rings or 5- to 7-membered carbocyclic or heterocyclic rings, wherein the unit

is present in the carbocyclic or heterocyclic rings adjacent to positions 3 and 5 of the dihydropyridine ring and wherein the carbocyclic or heterocyclic rings optionally comprise additional substituents, or one of the pairs $R^2/R^4$ and $R^3/R^5$ forms a 5- to 7-membered carbocyclic or heterocyclic ring, wherein the unit

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring, or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, —$NR^{13}$ groups, —S— or —O—, $R^{13}$ is selected from a hydrogen atom, an alkyl group, aryl group and aralkyl group, $R^6$ is selected from an alkyl group optionally substituted with a halogen atom or a —C(O) group, an optionally substituted aryl group, an optionally substituted aralkyl group, an optionally substituted heterocyclic group and the group

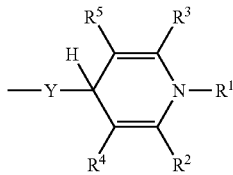

Y is an alkylene or arylene group, $R^7$ is a hydrogen atom, aryl group, aralkyl group or alkyl group, wherein the alkyl group and the alkyl unit of the aralkyl group optionally comprise one or more C—C double and/or C—C triple bonds, and $R^8$ and $R^9$ are independently selected from a hydrogen atom, an optionally substituted alkyl group, an optionally substituted aryl group and an optionally substituted aralkyl group.

The sensitizers of formula (V)

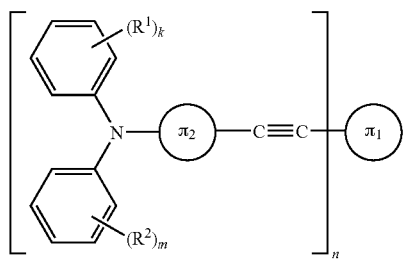

(V)

wherein $\pi_1$ and each $\pi_1$ independently represent an aromatic or heteroaromatic unit, each $R^1$ and $R^2$ is independently selected from a halogen atom, an alkyl, aryl or aralkyl group, a group —$NR^4R^5$ or a group —$OR^6$, $R^4$, $R^5$ and $R^6$ are independently selected from an alkyl, aryl and aralkyl group and n is an integer of at least 2 and k and m independently represent 0 or an integer from 1 to 5, which are described in more detail in DE 10 2004 051 810, as well as the oligomeric or polymeric compounds of formula (VI)

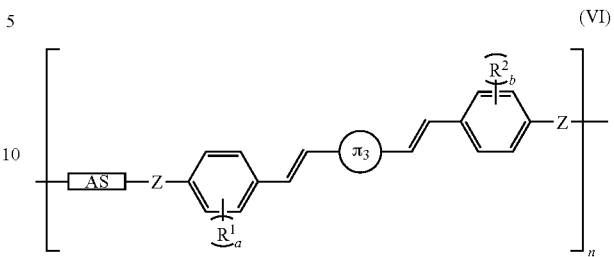

(VI)

wherein $\pi_3$ is an aromatic or heteroaromatic unit or a combination of the two so that a conjugated π-system is present between the two groups Z in structure (I), each Z independently represents a heteroatom connecting the spacer AS and the conjugated system, each $R^1$ and $R^2$ is independently selected from a halogen atom, an alkyl, aryl, alkylaryl or aralkyl group, a group —$NR^3R^4$ and a group —$OR^5$, each $R^3$, $R^4$ and $R^5$ is independently selected from an alkyl, aryl, alkylaryl and aralkyl group, a and b independently represent 0 or an integer from 1 to 4, n has a value of >1 and AS is an aliphatic spacer, which are described in more detail in DE 10 2004 055 733, are also suitable sensitizers for UV-sensitive elements.

If the radiation-sensitive elements are to be exposed with VIS laser diodes, the cyanopyridine derivatives described in WO 03/069411 A1 are for example suitable as sensitizers.

For IR-sensitive elements, the sensitizers are for example selected from carbon black, phthalocyanine pigments/dyes and pigments/dyes of the polythiophene, squarylium, thiazolium, croconate, merocyanine, cyanine, indolizine, pyrylium or metaldithiolin classes, especially preferred from the cyanine class. The compounds mentioned in Table 1 of U.S. Pat. No. 6,326,122 for example are suitable IR absorbers. Further examples can be found in U.S. Pat. No. 4,327,169, U.S. Pat. No. 4,756,993, U.S. Pat. No. 5,156,938, WO 00/29214, U.S. Pat. No. 6,410,207 and EP 1 176 007 A1.

According to one embodiment, a cyanine dye of formula (VII)

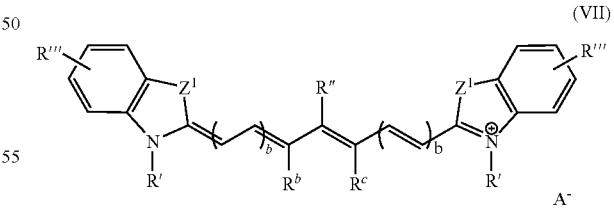

(VII)

is used, wherein each $Z^1$ independently represents S, O, $NR^a$ or $C(alkyl)_2$;

each R' independently represents an alkyl group, an alkylsulfonate group or an alkylammonium group;

R" represents a halogen atom, $SR^a$, $OR^a$, $SO_2R^a$ or $NR^a_2$;

each R''' independently represents a hydrogen atom, an alkyl group, —$COOR^a$, —$OR^a$, —$SR^a$, —$NR^a_2$ or a halogen atom; R''' can also be a benzofused ring;

A⁻ represents an anion;
R$^b$ and R$^c$ either both represent hydrogen atoms or, together with the carbon atoms to which they are bonded, form a carbocyclic five- or six-membered ring;
R$^a$ represents a hydrogen atom, an alkyl or aryl group;
each b is independently 0, 1, 2 or 3.

If R' represents an alkylsulfonate group, an internal salt can form so that no anion A⁻ is necessary. If R' represents an alkylammonium group, a second counterion is needed which is the same as or different from A⁻.

Of the IR dyes of formula (VII), dyes with a symmetrical structure are especially preferred. Examples of especially preferred dyes include:
2-[2-[2-Phenylsulfonyl-3-[2-(1,3-dihydro-1,3,3-trimethyl-2H-indole-2-ylidene)-ethylidene]-1-cyclohexene-1-yl]-ethenyl]-1,3,3-trimethyl-3H-indolium chloride,
2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indolium chloride,
2-[2-[2-thiophenyl-3-[2-(1,3-dihydro-1,3,3-trimethyl-2H-indole-2-ylidene)-ethylidene]-1-cyclopentene-1-yl]-ethenyl]-1,3,3-trimethyl-3H-indolium tosylate,
2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]-indolium tosylate and 2-[2-[2-chloro-3-[2-ethyl-(3H-benzthiazole-2-ylidene)-ethylidene]-1-cyclohexene-1-yl]-ethenyl]-3-ethyl-benzothiazolium tosylate.

The following compounds are also IR absorbers suitable for the present invention:

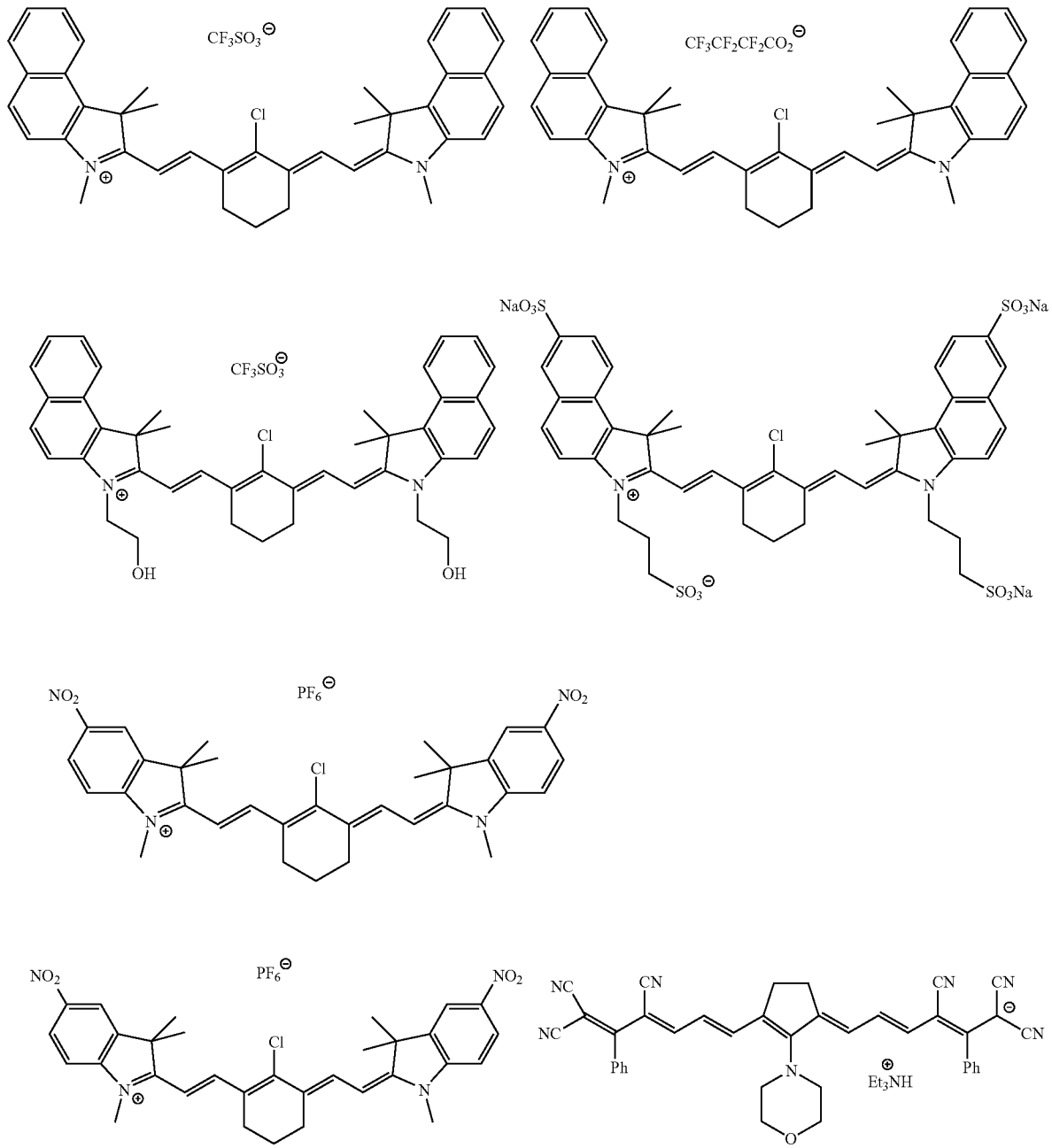

-continued
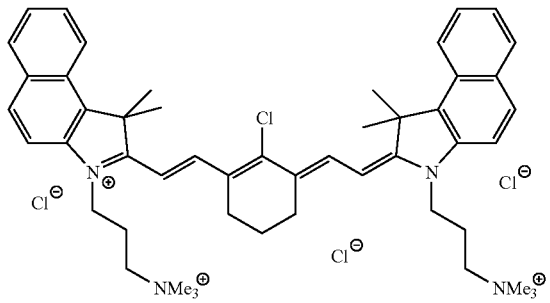
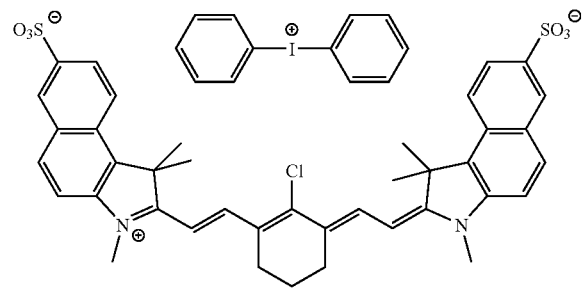
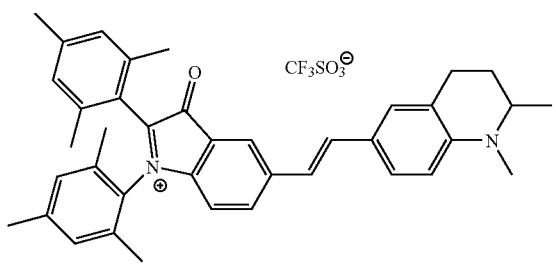
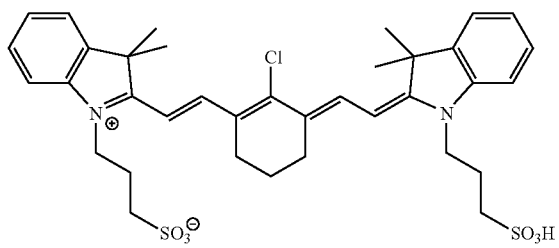
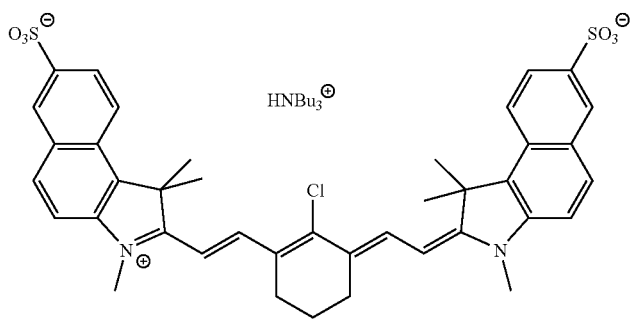
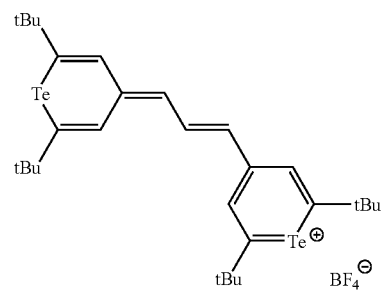
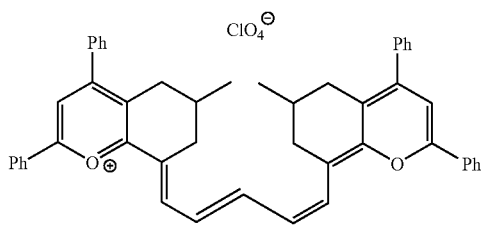
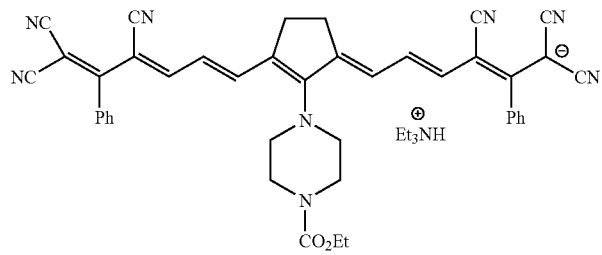
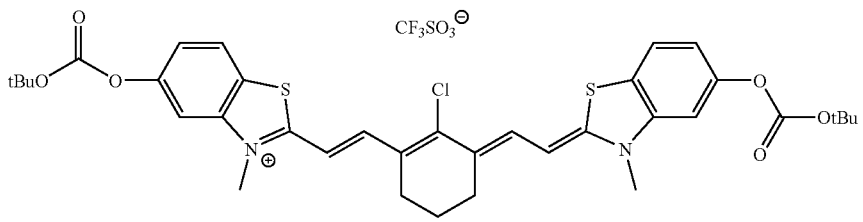

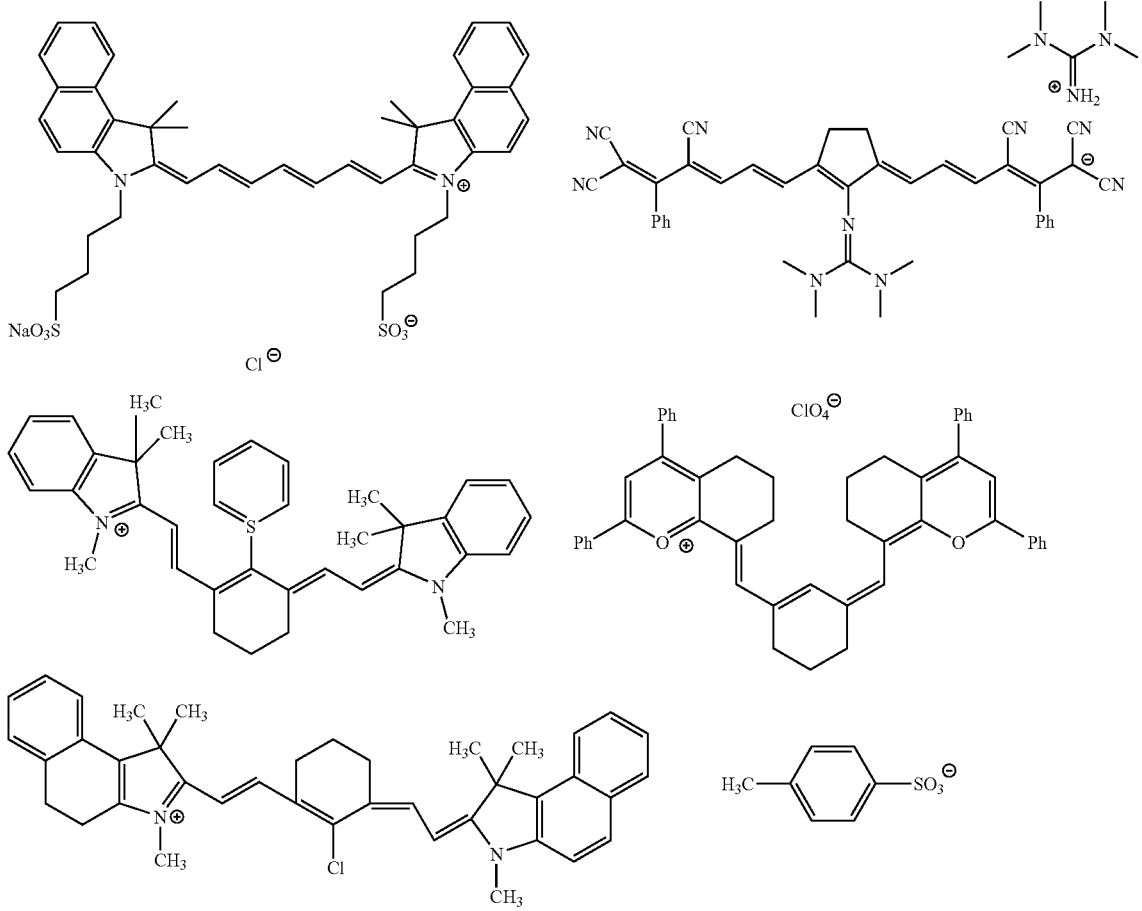

In the present invention, one sensitizer or a mixture of two or more can be used.

The sensitizers are used in combination with one or more coinitiators. Additionally, photoinitiators can be used; however, this is not preferred.

The amount of sensitizer(s) is not particularly restricted; however, if sensitizers are present, it is preferably in the range of 0.2 to 15 wt.-%, based on the dry layer weight, especially preferred 0.5 to 10 wt.-%. If both photoinitiators and sensitizers are present in the coating, their total amount is preferably 0.5 to 30 wt.-%, based on the dry layer weight, especially preferred 1 to 15 wt.-%.

A coinitiator as referred to in the present invention is a compound that is essentially unable to absorb when irradiated but forms free radicals together with the radiation-absorbing sensitizers used in the present invention. The coinitiators are for example selected from onium compounds, for example those where the onium cation is selected from iodonium (such as e.g. triaryliodonium salts), sulfonium (such as triarylsulfonium salts), phosphonium, oxylsulfoxonium, oxysulfonium, sulfoxonium, ammonium, diazonium, selenonium, arsenonium and N-substituted N-heterocyclic onium cations wherein N is substituted with an optionally substituted alkyl, alkenyl, alkinyl or aryl; N-arylglycines and derivatives thereof (e.g. N-phenylglycine); aromatic sulfonyl halides; trihalomethylarylsulfones; imides such as N-benzoyloxyphthalimide; diazosulfonates; 9,10-dihydroanthracene derivatives; N-aryl, S-aryl or O-aryl polycarboxylic acids with at least two carboxy groups of which at least one is bonded to the nitrogen, oxygen or sulfur atom of the aryl unit (e.g. aniline diacetic acid and derivatives thereof and other coinitiators described in U.S. Pat. No. 5,629,354); hexaarylbiimidazoles; thiol compounds (e.g. mercaptobenzthiazole, mercaptobenzimidazole and mercaptotriazole); 1,3,5-triazine derivatives with 1 to 3 $CX_3$ groups (wherein every X is independently selected from a chlorine or bromine atom, and is preferably a chlorine atom), such as e.g. 2-phenyl-4,6-bis(tri-chloromethyl)-s-triazine, 2,4,6-tris(trichloromethyl)-s-triazine, 2-methyl-4,6-bis(tri-chloromethyl)-s-triazine, 2-styryl-4,6-bis(trichloromethyl)-s-triazine, 2-(p-methoxystyryl)-4,6-bis (trichloromethyl)-s-triazine, 2-(4-methoxy-naphtho-1-yl)-4, 6-bis(trichloromethyl)-s-triazine, 2-(4-ethoxy-naphtho-1-yl)-4,6-bis(trichloromethyl)-s-triazine and 2-[4-(2-ethoxyethyl)-naphtho-1-yl]-4,6-bis(trichloromethyl)-s-triazine; oxime ethers and oxime esters, such as for example those derived from benzoin; metallocenes (preferably titanocenes, and especially preferred those with two five-membered cyclodienyl groups, such as e.g. cyclopentadienyl groups and one or two six-membered aromatic groups with at least one ortho fluorine atom and optionally also a pyrryl group, such as bis(cyclopentadienyl)-bis-[2,6-difluoro-3-(pyrr-1-yl)-phenyl]titanium and dicyclopentadiene-bis-2,4, 6-trifluorophenyl-titanium or zirconium); acylphosphine oxides, diacylphosphine oxides and peroxides (e.g. those listed in EP-A1-1 035 435 as activators of the type of an organic peroxide), α-hydroxy or α-amino acetophenones, acylphosphines, acylphosphinesulfides, carbonyl compounds such as aromatic ketones or quinones, e.g. benzophenone derivatives, Michler's ketone, thioxanthone derivatives, anthraquinone derivatives and fluorenone derivatives.

Suitable 2,2',4,4',5,5'-hexaarylbiimidazoles (in the following simply referred to as hexaarylbiimidazoles) are represented by the following formula (VIII):

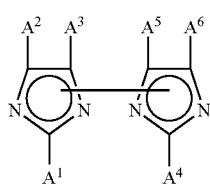

wherein $A^1$-$A^6$ are substituted or unsubstituted $C_5$-$C_{20}$ aryl groups which are identical or different from each other and in whose rings one or more carbon atoms can optionally be substituted by heteroatoms selected from O, N and S. Suitable substituents for the aryl groups are those that do not inhibit the light-induced dissociation to triarylimidazolyl radicals, e.g. halogen atoms (fluorine, chlorine, bromine, iodine), —CN, $C_1$-$C_6$ alkyl (optionally with one or more substituents selected from halogen atoms, —CN and —OH), $C_1$-$C_6$ alkoxy, $C_1$-$C_6$ alkylthio, ($C_1$-$C_6$ alkyl) sulfonyl.

Preferred aryl groups are substituted and unsubstituted phenyl, biphenyl, naphthyl, pyridyl, furyl and thienyl groups. Especially preferred are substituted and unsubstituted phenyl groups, and particularly preferred are halogen-substituted phenyl groups.

Examples include:
2,2'-Bis(bromophenyl)-4,4',5,5'-tetraphenylbiimidazole,
2,2'-bis(p-carboxyphenyl)-4,4',5,5''-tetraphenylbiimidazole,
2,2'-bis(o-chlorophenyl)-4,4',5,5'-tetrakis(p-methoxyphenyl)-biimidazole,
2,2'-bis(p-chlorophenyl)-4,4',5,5'-tetrakis(p-methoxyphenyl)-biimidazole,
2,2'-bis(p-cyanophenyl)-4,4' 5,5'-tetrakis(p-methoxyphenyl)-biimidazole,
2,2'-bis(2,4-dichlorophenyl)-4,4',5,5'-tetraphenylbiimidazole,
2,2'-bis(2,4-dimethoxyphenyl)-4,4',5,5'-tetraphenylbiimidazole,
2,2'-bis(o-ethoxyphenyl)-4,4',5,5'-tetraphenylbiimidazole,
2,2'-bis(m-fluorophenyl)-4,4',5,5'-tetraphenylbiimidazole,
2,2'-bis(o-fluorophenyl)-4,4',5,5'-tetraphenylbiimidazole,
2,2'-bis(p-fluorophenyl)-4,4',5,5'-tetraphenylbiimidazole,
2,2'-bis(o-hexoxyphenyl)-4,4',5,5'-tetraphenylbiimidazole,
2,2'-bis(o-hexylphenyl)-4,4',5,5'-tetrakis(p-methoxyphenyl)-biimidazole,
2,2'-bis(3,4-methylenedioxyphenyl)-4,4',5,5'-tetraphenylbiimidazole,
2,2'-bis(o-chlorophenyl)-4,4',5,5'-tetrakis(m-methoxyphenyl)biimidazole,
2,2'-bis(o-chlorophenyl)-4,4',5,5'-tetrakis[m-(betaphenoxymethoxyphenyl)]biimidazole,
2,2'-bis(2,6-dichlorophenyl)-4,4',5,5'-tetraphenylbiimidazole,
2,2'-bis(o-methoxyphenyl)-4,4',5,5'-tetraphenylbiimidazole,
2,2'-bis(p-methoxyphenyl)-4,4'-bis(o-methoxyphenyl)-5,5'-diphenylbiimidazole,
2,2'-bis(o-nitrophenyl)-4,4',5,5'-tetraphenylbiimidazole,
2,2'-bis(p-phenylsulfonylphenyl)-4,4',5,5'-tetraphenyl-biimidazole,
2,2'-bis(p-sulfamoylphenyl)-4,4',5,5'-tetraphenylbiimidazole,
2,2'-bis(2,4,5-trimethylphenyl)-4,4',5,5'-tetraphenylbiimidazole,
2,2'-di-4-biphenylyl-4,4',5,5'-tetraphenylbiimidazole,
2,2'-di-1-naphthyl-4,4',5,5'-tetrakis(p-methoxyphenyl)-biimidazole,
2,2'-di-9-phenanthryl-4,4',5,5'-tetrakis(p-methoxyphenyl)-biimidazole,
2,2'-diphenyl-4,4',5,5'-tetra-4-biphenylylbiimidazole,
2,2'-diphenyl-4,4',5,5'-tetra-2,4-xylylbiimidazole,
2,2'-di-3-pyridyl-4,4',5,5'-tetraphenylbiimidazole,
2,2'-di-3-thienyl-4,4',5,5'-tetraphenylbiimidazole,
2,2'-di-o-tolyl-4,4',5,5'-tetraphenylbiimidazole,
2,2'-di-p-tolyl-4,4'-di-o-tolyl-5,5'-diphenylbiimidazole,
2,2'-di-2,4-xylyl-4,4',5,5'-tetraphenylbiimidazole,
2,2',4,4',5,5'-hexakis(p-benzylthiophenyl)biimidazole,
2,2',4,4',5,5'-hexa-1-naphthylbiimidazole,
2,2',4,4',5,5'-hexaphenylbiimidazole,
2,2'-bis(2-nitro-5-methoxyphenyl)-4,4',5,5'-tetraphenylbiimidazole,
2,2'-bis(o-nitrophenyl)-4,4',5,5'-tetrakis(m-methoxyphenyl) biimidazole, and
2,2'-bis(2-chloro-5-sulfophenyl)-4,4',5,5'-tetraphenylbiimidazole,
and especially preferred:
2,2'-bis(o-chlorophenyl)-4,4',5,5'-tetraphenylbiimidazole,
2,2'-bis(o-chlorophenyl)-4,4',5,5'-tetra(p-fluorophenyl)biimidazole,
2,2'-bis(o-bromophenyl)-4,4',5,5'-tetra(p-iodophenyl)biimidazole,
2,2'-bis(o-chlorophenyl)-4,4',5,5'-tetra(p-chloronaphthyl)biimidazole,
2,2'-bis(o-chlorophenyl)-4,4',5,5'-tetra(p-chlorophenyl)biimidazole,
2,2'-bis(o-bromophenyl)-4,4',5,5'-tetra(p-chloro-p-methoxyphenyl)biimidazole,
2,2'-bis(o-chlorophenyl)-4,4',5,5'-tetra(o,p-dichlorophenyl) biimidazole,
2,2'-bis(o-chlorophenyl)-4,4',5,5'-tetra(o,p-dibromophenyl) biimidazole,
2,2'-bis(o-bromophenyl)-4,4',5,5'-tetra(o,p-dichlorophenyl) biimidazole or
2,2'-bis(o,p-dichlorophenyl)-4,4',5,5',-tetra(o,p-dichlorophenyl)biimidazole;
but the invention is not restricted to these compounds.

Suitable hexaarylbiimidazoles can be prepared according to known methods (see e.g. U.S. Pat. No. 3,445,232). A preferred process is the oxidative dimerization of corresponding triarylimidazoles with iron-(III)-hexacyanoferrate (II) in an alkali solution.

It is irrelevant for the purposes of the present invention which hexaarylbiimidazole isomer (or mixture of isomers) is used (e.g. 1,2'-, 1,1'-, 1,4', 2,2'-, 2,4'- and 4,4'-isomer), as long as it is photodissociable and provides triarylimidazolyl free radicals in the process.

The trihalogenmethyl compounds suitable as coinitiators are capable of forming free radicals. Trihalogenmethyl-substituted triazines and trihalogenmethyl-arylsulfones are preferred. The following can be mentioned as examples (without restricting the invention to these compounds):
2-(4-Methoxyphenyl)-4,6-bis(trichloromethyl)-s-triazine,
2-(4-chlorophenyl)-4,6-bis-(trichloromethyl)-s-triazine,
2-phenyl-4,6-bis(trichloromethyl)-s-triazine,
2,4,6-tris-(trichloromethyl)-s-triazine,
2,4,6-tris-(tribromomethyl)-s-triazine and
tribromomethylphenylsulfone.

Many coinitiators can also function as photoinitiators when they are exposed in their absorption band. This way, photosensitive layers can be obtained that are e.g. sensitive over a wide spectral range because a photoinitiator or sensitizer covers the long-wavelength spectral range (IR and/or visible range) and a coinitiator covers the short-wavelength spectral range (e.g. the UV range). This effect can be advantageous if the consumer wants to irradiate the same material with different radiation sources. In this case, the coinitiator functions as an actual coinitiator in the sense of the definition given above for the IR or visible range, while it functions as a photoinitiator for the UV range.

In the present invention, one coinitiator or a mixture of coinitiators can be used.

The amount of coinitiator(s) is not particularly restricted; however, it is preferably in the range of 0.2 to 25 wt.-%, based on the dry layer weight, especially preferred 0.5 to 15 wt.-%.

Further examples of suitable sensitizers and coinitiators for IR-sensitive coatings are also mentioned in WO 2004/041544, WO 2000/48836 and DE 10 2004 003143.

Free-Radical Polymerizable Component

All monomers, oligomers and polymers which comprise at least one C—C double bond can be used as free-radical polymerizable monomers, oligomers and polymers. Monomers/oligomers/polymers with C—C triple bonds can also be used, but they are not preferred. Suitable compounds are well known to the person skilled in the art and can be used in the present invention without any particular limitations. Esters of acrylic and methacrylic acids, itaconic acid, crotonic and isocrotonic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and trimethacrylate, pentaerythritol triacrylate and trimethacrylate, dipentaerythritolmonohydroxy pentaacrylate and pentamethacrylate, dipentaerythritol hexaacrylate and hexamethacrylate, pentaerythritol tetraacrylate and tetramethacrylate, ditrimethylol propane tetraacrylate and tetramethacrylate, diethyleneglycol diacrylate and dimethacrylate, triethyleneglycol diacrylate and dimethacrylate or tetraethyleneglycol diacrylate and dimethacrylate. Suitable oligomers and/or prepolymers are for example urethane acrylates and methacrylates, epoxide acrylates and methacrylates, polyester acrylates and methacrylates, polyether acrylates and methacrylates or unsaturated polyester resins.

In addition to monomers and/or oligomers, use can also be made of polymers comprising free-radical polymerizable C—C double bonds in the main or side chains. Examples thereof include reaction products of maleic acid anhydride copolymers and hydroxyalkyl(meth)acrylates (cf. e.g. DE 4 311 738 C1); (meth)acrylic acid polymers, partially or fully esterified with allyl alcohol (cf. e.g. DE 3 332 640 A1); reaction products of polymeric polyalcohols and isocyanatoalkyl(meth)acrylates; unsaturated polyesters; (meth)acrylate-terminated polystyrenes, poly(meth)acrylic acid ester, poly(meth)acrylic acids, poly(meth)acrylamides; (meth) acrylic acid polymers, partially or fully esterified with epoxides comprising free-radical polymerizable groups; and polymers with allyl side-groups which can for example be obtained by polymerization of allyl(meth)acrylate, optionally with further comonomers.

Free-radical polymerizable compounds that can be used in the present invention also include compounds that have a molecular weight of 3,000 or less and are reaction products obtained by reacting a diisocyanate with (i) an ethylenically unsaturated compound with one hydroxy group, and at the same time (ii) a saturated organic compound with one NH group and one OH group, wherein the reactants are used in amounts according to the following condition:

Number of moles of isocyanate groups≦number of moles of OH plus NH groups.

Examples of diisocyanates are represented by the following formula $$O=C=N-(CR^9_2)_a-D(CR^9_2)_b-N=C=O \quad (IX)$$

wherein a and b independently represent 0 or an integer from 1 to 3, each $R^9$ is independently selected from H and $C_1$-$C_3$ alkyl and D is a saturated or unsaturated spacer which can optionally comprise further substituents in addition to the two isocyanate groups. D can be a chain-shaped or a ring-shaped unit. As used in the present invention, the term "diisocyanate" refers to an organic compound comprising two isocyanate groups but no OH groups and no secondary and primary amino groups.

D can for example be an alkylene group $(CH_2)_w$, wherein w is an integer from 1 to 12, preferably 1 to 6, and one or more hydrogen atoms are optionally replaced with substituents such as e.g. alkyl groups (preferably $C_1$-$C_6$), a cycloalkylene group, an arylene group or a saturated or unsaturated heterocyclic group.

The ethylenically unsaturated compound (i), which comprises a hydroxy group, comprises at least one non-aromatic C—C double bond, which is preferably terminal. The hydroxy group is preferably not bonded to a doubly bonded carbon atom; the hydroxy group is not part of a carboxy group. In addition to the one OH group, the ethylenically unsaturated compound (i) does not comprise any further functional groups, such as e.g. NH, which can react with the isocyanate.

Examples of the ethylenically unsaturated compound (i) include
Hydroxy($C_1$-$C_{12}$)alkyl(meth)acrylates (e.g. 2-hydroxyethyl (meth)acrylate, 2- or 3-hydroxy-propyl(meth)acrylate, 2-, 3- or 4-hydroxybutyl(meth)acrylate), hydroxy($C_1$-$C_{12}$)alkyl-(meth)acrylamides (e.g. 2-hydroxyethyl(meth)acrylamide, 2- or 3-hydroxypropyl(meth)-acrylamide, 2-, 3- or 4-hydroxybutyl(meth)acrylamide), mono(meth)acrylates of oligomeric or polymeric ethylene glycols or propylene glycols (e.g. polyethylene glycol mono(meth)acrylate, triethylene glycol mono(meth)acrylate), allyl alcohol, pentaerythritol tri (meth)acrylate, 4-hydroxy($C_1$-$C_{12}$)alkylstyrene (e.g. 4-hydroxymethylstyrene), 4-hydroxystyrene, hydroxycyclohexyl(meth)acrylate.

The term "(meth)acrylate" as used in the present invention indicates that both methacrylate and acrylate etc. are meant.

The saturated organic compound (ii) is a compound with one OH and one NH group.

The saturated organic compound (ii) can for example be represented by the following formula (X) or (XI)

(X)

-continued

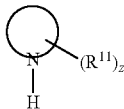
(XI)

wherein $R^{10}$ is a straight-chain (preferably $C_1$-$C_{12}$, especially preferred $C_1$-$C_4$), branched (preferably $C_3$-$C_{12}$, especially preferred $C_3$-$C_6$) or cyclic (preferably $C_3$-$C_8$, especially preferred $C_5$-$C_6$) alkyl group, E is a straight-chain (preferably $C_1$-$C_6$, especially preferred $C_1$-$C_2$), branched (preferably $C_3$-$C_{12}$, especially preferred $C_3$-$C_6$) or cyclic (preferably $C_3$-$C_8$, especially preferred $C_5$-$C_6$) alkylene group,

represents a saturated heterocyclic ring with 5 to 7 ring atoms, which in addition to the nitrogen atom shown above optionally comprises another heteroatom selected from S, O and $NR^{12}$, wherein $R^{12}$ is an alkyl group optionally substituted with an OH group, $R^{11}$ is OH or a straight-chain, branched or cyclic alkyl group substituted with an OH group, and z=0 if the heterocyclic ring comprises $NR^{12}$ and $R^{12}$ is an alkyl group substituted with OH and z=1 if the saturated heterocyclic ring does not comprise $NR^{12}$ or if the saturated heterocyclic ring comprises $NR^{12}$ and $R^{12}$ is an unsubstituted alkyl group.

The number of moles of isocyanate groups must not exceed the number of moles of OH groups and NH groups combined since the product should not comprise any more free isocyanate groups.

Additional suitable C—C unsaturated free-radical polymerizable compounds are described e.g. in EP 1 176 007 A2.

It is of course possible to use different kinds of monomers, oligomers or polymers in the mixture; furthermore, mixtures of monomers and oligomers and/or polymers can be used in the present invention, as well as mixtures of oligomers and polymers.

The free-radical polymerizable component is preferably used in an amount of 5 to 95 wt.-%, based on the dry layer weight, especially preferred 10 to 85 wt.-%.

Binders

The above described copolymers CP can be used as binders in photopolymerizable systems (UV/VIS or IR-sensitive).

If copolymers CP are used as the sole binder, they are preferably present in an amount of 5 to 95 wt.-%, based on the dry layer weight, especially preferred 10 to 85 wt.-%.

However, copolymers CP can also be used in admixture with other polymers/copolymers soluble or dispersible in aqueous alkaline developer, such as e.g. phenolic resins such as novolaks and resols, and copolymers of (meth)acrylic acid, N-phenylmaleimide and (meth)acrylamide (see DE 199 36 331). The total amount of binders is then preferably 5 to 95 wt.-%, based on the dry layer weight, especially preferred 10 to 85 wt.-%. The amount of novel copolymers preferably accounts for 5 to 95% of the total amount of binders, especially preferred 10 to 85 wt.-%.

Negative Diazo-Systems (UV-Sensitive)

Another type of negative working UV-sensitive coating—applied onto a substrate—comprises a diazonium polycondensation product; here as well, the above described copolymers CP can be used as the sole binder or together with other binders.

Diazonium polycondensation products known to the person skilled in the art can be used as diazonium polycondensation product. Such condensation products can for example be prepared according to known methods by condensing a diazo monomer described in EP-A-0 104 863 with a condensation agent such as formaldehyde, acetaldehyde, propionaldehyde, butyraldehyde, isobutylaldehyde or benzaldehyde. Furthermore, co-condensation products are used which in addition to the diazonium salt units also comprise other units which are not photosensitive and are derived from condensable compounds, in particular aromatic amines, phenols, phenol ethers, aromatic thiol ethers, aromatic hydrocarbons, aromatic heterocycles and organic acid amides. Especially advantageous examples of the diazonium polycondensation products include reaction products of diphenylamine-4-diazonium salts, which optionally contain a methoxy group in the phenyl group carrying the diazo group, and formaldehyde or 4,4'-bismethoxymethyldiphenylether. Aromatic sulfonates such as 4-tolylsulfonate or mesitylene sulfonate, tetrafluoroborate, hexafluorophosphate, hexafluoroantimonate and hexafluoroarsenate are especially suitable as anions of these diazo resins. The diazonium polycondensation product is preferably present in an amount of 3 to 60 wt.-% in the photosensitive composition.

Hybrid systems of diazonium polycondensation products and the above-mentioned UV-sensitive free-radical polymerizable system can also be used as binders in the negative working radiation-sensitive coating together with the copolymers CP.

In this type of negative working UV-sensitive coating, the above copolymer CP as the sole binder is preferably present in an amount of 5 to 95 wt.-%, based on the dry layer weight, especially preferred 10 to 85 wt.-%.

However, the above described copolymers CP can also be used in admixture with other polymers/copolymers soluble or dispersible in aqueous alkaline developer, such as e.g. phenolic resins such as novolaks and resols, and copolymers of (meth)acrylic acid, N-phenyl-maleimide and (meth)acrylamide (see DE 199 36 331). The total amount of binders is then preferably 5 to 95 wt.-%, based on the dry layer weight, especially preferred 10 to 85 wt.-%. The amount of the above copolymers CP preferably accounts for 5 to 95% of the total amount of binders, especially preferred 10 to 85%.

Single-Layer Negative Working IR-Sensitive Elements

The above described copolymer CP can also be used as binder in the production of another type of negative working single-layer IR-sensitive elements wherein the radiation-sensitive layer on a substrate is rendered insoluble in or impenetrable by aqueous alkaline developer upon IR irradiation and comprises (i) at least one compound which forms an acid upon the application of heat (in the following also referred to as "latent Bronsted acid"), and (ii) a component cross-linkable by an acid (in the following also referred to as "cross-linking agent") or a mixture thereof and (iii) at least one IR absorber.

Systems based on this principle are for example described in EP 0 625 728 B1 and EP 0 938 413 B1.

All the sensitizers described above which absorb radiation from the IR range (more than 750 to 1,200 nm) can be used as IR absorbers.

Ionic and nonionic Bronsted acids can be used as latent Bronsted acid. Examples of ionic latent Bronsted acids include onium salts, in particular iodonium, sulfonium, oxysulfoxonium, oxysulfonium, phosphonium, selenonium, telluronium, diazonium and arsonium salts. Specific examples are diphenyliodonium-hexafluorophosphate, triphenylsulfonium-hexafluoro-antimonate, phenylmethyl-ortho-cyanobenzylsulfonium-tri-fluoromethanesulfonate and 2-methoxy-4-aminophenyl-diazonium-hexafluorophosphate.

Examples of nonionic latent Bronsted acids include $RCH_2X$, $RCHX_2$, $RCX_3$, $R(CH_2X)_2$ and $R(CH_2X)_3$, wherein X represents Cl, Br, F or $CF_3SO_3$ and R is an aromatic, aliphatic or araliphatic group.

Ionic latent Bronsted acids of the formula

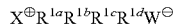

$$X^{\oplus}R^{1a}R^{1b}R^{1c}R^{1d}W^{\ominus}$$

are also suitable, wherein if X represents iodine, $R^{1c}$ and $R^{1d}$ are free electron pairs and $R^{1a}$ and $R^{1b}$ are aryl groups or substituted aryl groups,
if X represents S or Se, $R^{1d}$ is a free electron pair and $R^{1a}$, $R^{1b}$, $R^{1c}$ are independently selected from aryl groups, substituted aryl groups, an aliphatic group or substituted aliphatic group,
if X represents P or As, $R^{1d}$ can be an aryl group, substituted aryl group, aliphatic group or substituted aliphatic group, and wherein W is selected from $BF_4$, $CF_3SO_3$, $SbF_6$, $CCl_3CO_2$, $ClO_4$, $AsF_6$ or $PF_6$.

$C_1$-$C_5$-alkyl sulfonates, arylsulfonates (e.g. benzoin tosylate, 2-hydroxymethylbenzoin tosylate and 2,6-dinitrobenzyl tosylate) and N—$C_1$-$C_5$-alkyl-sulfonylsulfonamides (e.g. N-methanesulfonyl-p-toluene-sulfonamide and N-methanesulfonyl-2,4-dimethylbenzene-sulfonamide) are also suitable.

Specific suitable onium compounds are for example listed in detail in U.S. Pat. No. 5,965,319 as formulas (I) to (III).

The latent Bronsted acids are preferably used in an amount of 0.5 to 50 wt.-%, especially preferred 3 to 20 wt.-%, based on the dry layer weight.

The cross-linking agent can for example be a resin, selected from resols, $C_1$-$C_5$-alkoxymethylmelamines, $C_1$-$C_5$-alkoxymethyl-glycoluril resins, poly($C_1$-$C_5$-alkoxy-methyl-styrenes) and poly($C_1$-$C_5$-alkoxymethylacrylamides), epoxidized novolak resins and urea resins. In particular, compounds comprising at least 2 groups in a molecule, selected from hydroxymethyl, alkoxymethyl, epoxy and vinylether groups, bonded to an aromatic ring, can be used as cross-linking agents; of those, phenol derivatives with at least 2 groups selected from hydroxymethyl and alkoxymethyl groups, bonded to a benzene ring, 3 to 5 benzene rings and a molecular weight of 1,200 or less, as listed in columns 31 to 37 of U.S. Pat. No. 5,965,319, are preferred.

The cross-linking agent is preferably used in an amount of 5 to 90 wt.-%, based on the dry layer weight, especially preferred 10 to 60 wt.-%.

Copolymer CP can act as the binder in the radiation-sensitive layer. However, optionally one or more additional binder can be present, for example selected from alkali-soluble or dispersible (co)polymers, such as novolaks, acetone pyrogallol resin, polyhydroxystyrenes and hydroxy-styrene-N-substituted maleimide-copolymers as listed in U.S. Pat. No. 5,965,319 as component (C), polymers as mentioned in U.S. Pat. No. 5,919,601 as binder resins and copolymers as described in DE 199 36 331.

If copolymers CP are used as the sole binder, they are preferably present in an amount of 5 to 95 wt.-%, based on the dry layer weight, especially preferred 5 to 60 wt.-%. If they are used in admixture with other polymers/copolymers, their amount in the total amount of binders (preferably 5 to 95 wt.-%, based on the dry layer weight, especially preferred 10 to 85 wt.-%) accounts for preferably 5 to 95 wt.-%, based on the total amount of binders, especially preferred 10 to 85 wt.-%.

In principle, known IR-sensitive elements with a single-layer structure, as for example described in U.S. Pat. No. 5,919,601 and WO 00/17711 A1, can be modified by the additional use of copolymer CP in the coating. In a single-layer structure, the modified polymer is preferably used in an amount of 5 to 80 wt.-%, based on the dry layer weight, especially preferred 20 to 60 wt.-%.

Positive Working Radiation-Sensitive Elements

UV-Sensitive

Positive working UV-sensitive elements can for example be based on quinone diazides (preferably naphthoquinone diazides) and novolaks, as for example described in U.S. Pat. No. 4,594,306. The above described copolymers CP can be used as binders in such coatings.

If copolymers CP are used as the sole binder, they are preferably present in an amount of 5 to 95 wt.-%, based on the dry layer weight, especially preferred 10 to 85 wt.-%.

However, copolymers CP can also be used in admixture with other polymers/copolymers soluble or dispersible in aqueous alkaline developer, such as e.g. phenolic resins such as novolaks and resols, and copolymers of (meth)acrylic acid, N-phenylmaleimide and (meth)acrylamide (see DE 199 36 331). The total amount of binders is then preferably 5 to 95 wt.-%, based on the dry layer weight, especially preferred 10 to 85 wt.-%. The amount of copolymers CP preferably accounts for 5 to 95% of the total amount of binders, especially preferred 10 to 85%.

IR-Sensitive

There are numerous examples of positive working IR-sensitive elements, which can be divided into two groups: those with one layer and those with two layers.

Single-Layer Plates

The above described copolymers CP can also be used as binders in single-layer positive working IR-sensitive elements in order to increase their resistance to chemicals and abrasion resistance. The known single-layer positive working IR-sensitive elements are usually not bakeable so that baking is not an option for improving these properties. The use of copolymers CP improves resistance even without baking and it can be improved even further by baking. Usually, single-layer positive working IR-sensitive elements comprise
(a) an optionally pretreated substrate
(b) a positive working heat-sensitive layer comprising
  (i) at least one polymer soluble in aqueous alkaline developer, such as e.g. a novolak resin,
  (ii) at least one component which reduces the aqueous alkaline developer solubility of the developer soluble polymer (e.g. novolak), wherein said reduction in solubility is reversed upon the application of heat ("insolubilizer"), and (iii) optionally an IR absorber (i.e. a compound which absorbs IR radiation and converts it to heat),
wherein components (i) and (ii) do not have to be present as separate substances but can be used in the form of an accordingly functionalized novolak. It is also possible to use an IR absorber that also acts as insolubilizer. Such single-layer IR-sensitive positive working elements are for example described in EP 825 927 B1.

Polymers with hydroxyl, carboxylic acid, amino, amide and maleimide groups can for example be used as polymers soluble in aqueous alkaline developer. In particular, these compounds include phenolic resins, copolymers of 4-hydroxystyrene and 3-Methyl-4-hydroxystyrene or 4-methoxystyrene, copolymers of (meth)acrylic acid and styrene, copolymers of maleimides and styrene, hydroxy- or carboxy-functionalized celluloses, copolymers of maleic acid anhydride and styrene and partially hydrolyzed polymers of maleic acid anhydride. Phenolic acids, in particular novolak, are especially preferred.

Suitable novolak resins are condensation products of phenols, e.g. phenol itself, C-alkyl-substituted phenols (including cresols, xylenols, p-tert-butylphenol, p-phenylphenol and nonyl phenols) and diphenols (e.g. bisphenol-A), with suitable aldehydes such as formaldehyde, acetaldehyde, propionaldehyde, and furfuraldehyde. The type of catalyst and the molar ratio of the reactants determine the molecular structure and thus the physical properties of the resin. An aldehyde/phenol ratio of about 0.5:1 to 1:1, preferably 0.5:1 to 0.8:1, and an acid catalyst are used in order to produce those phenolic resins known as "novolaks" and having a thermoplastic character. However, as used in the present application, the term "novolak resin" should also encompass the phenolic resins known as "resols" which are obtained at higher aldehyde/phenol ratios and in the presence of alkaline catalysts.

Based on the dry layer weight, the novolak resin is preferably present in an amount of at least 40 wt.-%, more preferred at least 50 wt.-%, even more preferred at least 70 wt.-% and particularly preferred at least 80 wt.-%. Usually, the amount does not exceed 95 wt.-%, more preferred 85 wt.-%.

The chemical structure of the IR absorber is not particularly restricted as long as it is capable of converting the absorbed radiation into heat. The IR absorbers mentioned above in connection with photopolymerizable IR-sensitive elements can be used. The IR absorber is preferably present in an amount of at least 0.1 wt.-% based on the dry layer weight, more preferred at least 1 wt.-%, and particularly preferred at least 2 wt.-%. Usually, the amount of IR absorber does not exceed 25 wt.-%, more preferred 20 wt.-% and particularly preferred 15 wt.-%. Either a single IR absorber or a mixture of two or more can be present; in the latter case, the amounts given refer to the total amount of all IR absorbers.

The amount of IR absorber to be used also has to be considered in view of the dry layer thickness of the coating. It should preferably be selected such that the optical density of the coating—measured for example on a transparent polyester film—preferably shows values between 0.4 and 1.0 at the wavelength of the IR light with which the coating is irradiated.

The IR-sensitive coating furthermore comprises at least one substance that reduces the aqueous alkaline developer solubility of the polymer like novolak, whereby this reduction in solubility is reversed by the application of heat. In the following, this substance is briefly referred to as "insolubilizer". The insolubilizer may or may not be covalently bonded to a polymer.

Use can be made of insolubilizers already described in the prior art or of different ones.

Suitable insolubilizers include for example the compounds described in WO 98/42507 and EP-A 0 823 327 which are not photosensitive and comprise functional groups that can enter into a hydrogen bond with the phenolic OH groups of novolak resins. WO 98/42507 mentions sulfone, sulfoxide, thion, phosphinoxide, nitrile, imide, amide, thiol, ether, alcohol, urea, nitroso, azo, azoxy and nitro groups, halogens and in particular keto groups as suitable functional groups. Xanthone, flavanone, flavone, 2,3-diphenyl-1-indenone, pyrone, thiopyrone and 1'-(2'-acetonaphthonyl)benzoate are mentioned as examples of suitable compounds.

In WO 99/01795, polymers with specific functional groups Q which preferably do not comprise diazide groups, acid groups or acid-forming groups are used as insolubilizers, and according to a preferred embodiment, Q is selected from amino, monoalkylamino, dialkylamino, amido, monoalkylamino, dialkylamido groups, fluorine atoms, chlorine atoms, carbonyl, sulfinyl or sulfonyl groups. These polymeric insolubilizers can also be used in the present invention.

The insolubilizers described in WO 99/01796, in this case compounds with diazide units, can be used in the present invention as well.

Another group of insolubilizers suitable for use in the present invention is described in WO 97/39894. They are e.g. nitrogen-containing compounds wherein at least one nitrogen atom is quaternized and forms part of a heterocyclic ring; examples include e.g. quinolinium compounds, benzothiazolium compounds and pyridinium compounds, and in particular cationic trimethylmethane dyes such as Victoria Blue (C I Basic Blue 7), crystal violet (C I Basic Violet 3) and ethyl violet (C I Basic Violet 4). Furthermore, compounds with carbonyl function such as N-(4-bromobutyl)-phthalimide, benzophenone and phenanethrenequinone are mentioned. Compounds of the formula $Q_1$-S(O)$_n$-$Q_2$ (wherein $Q_1$=optionally substituted phenyl or alkyl group; n=0, 1 or 2; $Q_2$=halogen atom or alkoxy group), Acridine Orange Base and ferrocenium compounds can be used as well.

If the IR absorbers comprise the structural elements mentioned in WO 97/39894, they also function as insolubilizers.

The functionalized novolaks described in U.S. Pat. No. 6,320,018 B can be used in the heat-sensitive elements of the present invention as well. These novolaks contain substituents which allow a two- or four-center hydrogen bond (preferably a four-center hydrogen bond, also named quadrupol hydrogen bonding QHB) between the polymer molecules. This also decreases the aqueous alkaline developer solubility of the underlying novolak. Such hydrogen bonds are broken by heating and the original solubility of the novolak is restored. If such a functionalized novolak is used, it assumes the function of components (i) and (ii) of the heat-sensitive composition so that the additional use of a novolak without corresponding functional groups and/or an insolubilizer as described above is not necessary, but not excluded, either.

The functionalized novolaks comprise at least one covalently bonded unit and at least one non-covalently bonded unit, with the non-covalent bond being thermally unstable; these novolaks have a two- or four-center hydrogen bond at essentially every non-covalently bonded unit. A preferred group of such functionalized novolaks which can be used as novolak with a simultaneous insolubilizing function can be described with the following formula (XII):

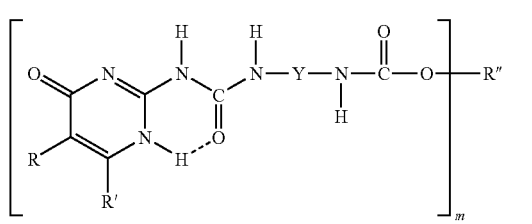

(XII)

wherein R and R' are independently selected from a hydrogen atom and a cyclic or straight or branched saturated or unsaturated hydrocarbon group with preferably 1 to 22 carbon atoms (preferably hydrogen and $C_1$-$C_4$ alkyl), R" is a phenolic group derived from a novolak R"(OH)$_p$, Y is a divalent cyclic or straight or branched saturated or unsaturated hydrocarbon group with preferably 1 to 22 carbon atoms derived from a diisocyanate of the formula Y(NCO)$_2$ (e.g. isophorone diisocyanate, toluene-1,2-diisocyanate, 3-isocyanatomethyl-1-methylcyclo-hexylisocyanate), m is at least 1 and p is 1 or 2.

The preparation of functionalized novolaks of formula (XII) can e.g. be inferred from US 2002/0,150,833 A1.

Another class of suitable functionalized resins, such as e.g. functionalized phenolic resins and in particular functionalized novolaks, is disclosed in U.S. Pat. No. 6,537,735 B. While the non-functionalized resin is soluble in aqueous alkaline developer, the functionalized resin is insoluble in the developer; however, the application of heat (for example generated by IR radiation) renders it soluble in the developer. Preferably, the non-functionalized resin comprises OH or SH groups which in the functionalized resin are at least partially converted to covalently bonded functional groups Q; preferably, the functional groups Q are formed via an esterification reaction of the OH groups and are preferably selected from —O—SO$_2$-tolyl, —O-dansyl, —O—SO$_2$-thienyl, —O—SO$_2$-naphthyl and —O—CO-phenyl. The ratio of functional groups Q to OH groups is preferably 1:100 to 1:2, more preferred 1:50 to 1:3. The novolak resins, resols, acrylic resins with phenolic side chains and hydroxystyrenes described above can for example be used as non-functionalized resins. An especially preferred functionalized resin of this class is a phenolic resin (preferably a novolak), partially (e.g. 10 to 20%) esterified with toluenesulfonic acid or sulfonic acid chloride; however, all the other functionalized resins described in U.S. Pat. No. 6,537,735 can be used in the present invention as well.

Although all the insolubilizers mentioned above can be used in the heat-sensitive coating of the present invention, the following are preferred: Cyanine dyes, triarylmethane dyes, quinolinium compounds, the above insolubilizers with (a) keto group(s) and the above insolubilizers with (a) sulfone group(s), as well as novolaks functionalized with substituents capable of forming four-center hydrogen bonds. The cyanine dyes, triarylmethane dyes, quinolinium compounds, ketones and sulfones can be used as low-molecular substances or bonded to a polymer.

A single insolubilizer or mixtures of two or more compounds can be used in the heat-sensitive elements of the present invention.

The amount of insolubilizer(s) is not particularly restricted as long as it reduces the aqueous alkaline developer solubility of the novolak. However, the solubility reduction has to take place to such an extent that when an aqueous alkaline developer is used, the heated areas of the coating are removed considerably faster than the non-heated areas.

Independently of whether the insolubilizer also functions as IR absorber, it is preferably present in an amount of at least 0.1 wt.-% based on the dry layer weight, more preferred at least 0.5 wt.-%, especially preferred at least 1 wt.-% and particularly preferred at least 2 wt.-%. Preferably, no more than 25 wt.-%, more preferred no more than 15 wt.-%, are used.

If the above described copolymers CP are used as the sole binder, they are preferably present in an amount of 1 to 99 wt.-%, based on the dry layer weight, especially preferred 10 to 98 wt.-%.

However, copolymers CP can also be used in admixture with other polymers/copolymers soluble or dispersible in aqueous alkaline developer, such as e.g. phenolic resins such as novolaks and resols, and copolymers of (meth)acrylic acid, N-phenylmaleimide and (meth)acrylamide (see DE 199 36 331). The total amount of binders is then preferably 1 to 99 wt.-%, based on the dry layer weight, especially preferred 10 to 98 wt.-%. The amount of copolymers CP preferably accounts for 5 to 95% of the total amount of binders.

It has been shown that at least some of copolymers CP can also be used as the sole polymers in IR-sensitive single-layer elements; i.e. the positive working heat-sensitive layer does not comprise a novolak or the like as a component that interacts with an insolubilizer, but it only comprises, in addition to optional coating components, (a) at least one copolymer CP, (b) an insolubilizer and optionally (c) an IR absorber, whereby it is also possible to use an IR absorber which acts as an insolubilizer at the same time.

Layers consisting of an IR absorber and copolymer CP (and possibly optional additives) are imagable in particular if unit (C) of the copolymer is a unit of formula (C-2), such as e.g. ureylmethacrylate.

Dual-Layer Plates

They can also be positive working dual-layer elements wherein a first layer is provided on the hydrophilic surface of the substrate which is soluble in aqueous alkaline developer and a top layer ("masking layer") on top of the first layer which is not dispersible or soluble in and not penetrable by an aqueous alkaline developer, and which is rendered soluble or dispersible in or penetrable by the developer by IR irradiation.

The above described copolymers CP are suitable as binders for the first ("lower") layer of such dual-layer positive working IR-sensitive elements; they can be used as the sole binder or in admixture with other polymers/copolymers soluble or dispersible in aqueous alkaline developer, such as e.g. phenolic resins such as novolaks and resols, and copolymers of (meth)acrylic acid, N-phenylmaleimide and (meth)acrylamide (see DE 199 36 331).

If copolymers CP are used as the sole binder, they are preferably present in an amount of 5 to 99 wt.-%, based on the dry layer weight, especially preferred 10 to 98 wt.-%. If they are used in admixture with other binders, their amount preferably accounts for 5 to 95% of the total amount of binders.

An IR absorber ("photothermal conversion material") is present in the first layer, or the top layer or in both layers; it can also be present in a separate "absorber layer". Preferably the IR absorber is present in the first layer.

The chemical structure of the IR absorber is not particularly restricted as long as it is capable of converting the absorbed IR radiation into heat. The IR absorbers mentioned above in connection with photopolymerizable IR-sensitive elements can be used. The IR absorber is preferably present in an amount of at least 1 wt.-% based on the dry layer weight of the layer in which it is present, more preferred at least 2 wt.-%, and particularly preferred at least 5 wt.-%. Usually, the amount of IR absorber does not exceed 35 wt.-%, more preferred 30 wt.-% and particularly preferred 25 wt.-% of the layer in which it is present. If the IR absorber is only present in the first layer, its amount in said layer is preferably from 10 to 20 wt.-%, based on the dry layer weight of the first layer. Either a single IR absorber or a mixture of two or more can be present; in the latter case, the amounts given refer to the total amount of all IR absorbers present in one layer.

The top layer protects the first layer from being dissolved by an aqueous alkaline developer. It is therefore necessary that the top layer itself is not soluble or dispersible in or penetrable by an aqueous alkaline developer. By the wording "not soluble in, dispersible in or penetrable by an aqueous alkaline developer", it is meant that the top layer can resist the attack of an aqueous alkaline developer having a pH of at least 8 for at least 2 minutes. However, upon exposure to IR radiation the top layer becomes removable by an aqueous alkaline developer (necessary dwell time: less than 2 minutes).

Various dual-layer plates are known in the art, however, the mechanisms of change of solubility/dispersibility/penetrability due to exposure to IR radiation are still not fully understood. Such dual-layer systems are for instance described in U.S. Pat. No. 6,352,812, U.S. Pat. No. 6,352,811, U.S. Pat. No. 6,358,669, US 2002/0,150,833 A1, U.S. Pat. No. 6,320,018, U.S. Pat. No. 6,537,735 and WO 02/14071, In principle, the following types of top layers are known:
a) The top layer comprises a polymer like a novolak which itself is soluble/dispersible in an aqueous alkaline developer and an "insolubilizer" which reduces the solubility/dispersibility to such a high degree that the layer is not soluble or penetrable under developing conditions. The interaction between the polymer and the inhibitor is deemed to be weakened by IR radiation to such a degree that the irradiated (heated) areas of the layer are rendered soluble/dispersible in or penetrable by the developer. Such systems are for example described in U.S. Pat. No. 6,352,811 and U.S. Pat. No. 6,358,669. The polymer/insolubilizer systems can be the same as those described above for single layer plates.
(b) The top layer comprises a polymer like a novolak which as such is soluble/dispersible in an aqueous alkaline developer but which has been chemically modified (for instance by chemically binding an "insolubilizer") so that it is not soluble/dispersible/penetrable by an aqueous alkaline developer. Such functionalized resins (like e.g. functionalized novolaks) are for instance described in US 2002/0,150,833 A1, U.S. Pat. No. 6,320,018 B and U.S. Pat. No. 6,537,735 B.

The top layer can also comprise a polymer which is not soluble/dispersible in an aqueous alkaline developer at usual developing conditions (i.e. the top layer can resist the attack of a developer for at least 2 minutes).

It is assumed that either there are any interactions within the top layer which are weakened by IR radiation or microcracks and/or bubbles are formed in the top layer or in the interface between first layer and top layer due to exposure to IR radiation (and the heat created thereby) which allows removal of the initially insoluble/impenetrable top layer together with the soluble bottom layer by the developer in the exposed areas.

Polymers and copolymers with phenolic OH groups, i.e. phenolic resins, are preferably used for a top layer of the type (a) as described above. Suitable phenolic resins include e.g. novolaks, resols, acrylic resins with phenolic side chains and polyvinyl phenolic resins, whereby novolaks are especially preferred.

Novolak resins suitable for the present invention are condensation products of suitable phenols, e.g. phenol itself, C-alkyl-substituted phenols (including cresols, xylenols, p-tert-butylphenol, p-phenylphenol and nonylphenols), and of diphenols (e.g. bisphenol-A), with suitable aldehydes such as formaldehyde, acetaldehyde, propionaldehyde and furfuraldehyde. The type of catalyst and the molar ratio of the reactants determine the molecular structure and thus the physical properties of the resin. An aldehyde/phenol ratio of about 0.5:1 to 1:1, preferably 0.5:1 to 0.8:1, and an acid catalyst are used in order to produce those phenolic resins known as "novolaks" which have a thermoplastic character. As used in the present application, however, the term "novolak resin" should also encompass the phenolic resins known as "resols" which are obtained at higher aldehyde/phenol ratios and in the presence of alkaline catalysts.

The amount of insolubilizer(s) in a top layer of type (a) above is not particularly restricted as long as it reduces the aqueous alkaline developer solubility of the novolak. However, the solubility reduction has to take place to such an extent that when an aqueous alkaline developer is used, the heated areas of the coating are removed considerably faster than the non-heated areas.

The insolubilizer is preferably present in an amount of at least 0.1 wt.-% based on the dry layer weight, more preferred at least 0.5 wt.-%, especially preferred at least 2 wt.-% and particularly preferred at least 5 wt.-%. Preferably, no more than 40 wt.-%, more preferred no more than 25 wt.-%, are used.

Polymers useful for a top layer of type (b) are for instance functionalized novolaks like those of formula (XII) mentioned above and functionalized phenolic resins like those mentioned in U.S. Pat. No. 6,537,735 B (e.g. tosylated novolaks), see also above under the headline "Single-layer plates". Modified alkylphenol resins (like those commercially available from Schenectady under the trade name SP1077 and HRJ302) as well as novolaks based on xylenol and cresol (like those commercially available from AZ-Electronics under the trade name SPN-572) are also useful for a top layer of type (b).

Optional Components

Independently of whether the element is UV/VIS- or IR-sensitive, the radiation-sensitive coating can comprise one or more of the following optional components in addition to the essential components. If the coating consists of several layers, the optional component can be present in one, several or all of the layers. Dyes or pigments having a high absorption in the visible spectral range can be present in order to increase the contrast ("contrast dyes and pigments"). Particularly suitable dyes and pigments are those that dissolve well in the solvent or solvent mixture used for coating or are easily introduced in the disperse form of a pigment. Suitable contrast dyes include inter alia rhodamine dyes, triarylmethane dyes such as Victoria blue R and Victoria blue BO, crystal violet and methyl violet, anthraquinone pigments, azo pigments and phthalocyanine dyes and/or pigments. The colorants are preferably present in an amount of 0 to 15 wt.-%, more preferred 0.5 to 10 wt.-%, particularly preferred 1.5 to 7 wt.-%, based on the dry layer weight.

Furthermore, the layer(s) can comprise surfactants (e.g. anionic, cationic, amphoteric or non-ionic tensides or mixtures thereof). Suitable examples include fluorine-containing polymers, polymers with ethylene oxide and/or propylene oxide groups, sorbitol-tri-stearate and alkyl-di-(aminoethyl)- glycines. They are preferably present in an amount of 0 to 10 wt.-%, based on the dry layer weight, especially preferred 0.2 to 5 wt.-%.

The layer(s) can furthermore comprise print-out dyes such as crystal violet lactone or photochromic dyes (e.g. spiropyrans etc.). They are preferably present in an amount of 0 to 15 wt.-%, based on the dry layer weight, especially preferred 0.5 to 5 wt.-%.

Also, flow improvers can be present in the layer(s), such as poly(glycol)ether-modified siloxanes; they are preferably present in an amount of 0 to 1 wt.-%, based on the dry layer weight.

The layer(s) can furthermore comprise antioxidants such as e.g. mercapto compounds (2-mercapto-benzimidazole, 2-mercaptobenzthiazole, 2-mercaptobenzoxazole and 3-mercapto-1,2,4-triazole), and triphenylphosphate. They are preferably used in an amount of 0 to 15 wt.-%, based on the dry layer weight, especially preferred 0.5 to 5 wt.-%.

Other coating additives can of course be present as well.

Production of the Precursors

The radiation-sensitive composition and optional additional layers can be applied to the surface of the substrate by means of common coating processes, e.g. spin coating, dip coating, spray coating, coating with a slot coater and coating by means of a doctor blade. It is possible to apply the radiation-sensitive composition and further layers on both sides of the substrate; however, it is preferred that the radiation-sensitive coating be only applied to one side of the substrate.

Imaging

If the sensitizer absorbs UV/VIS radiation, the thus produced radiation-sensitive elements are image-wise exposed in a manner known to the person skilled in the art with UV/IS radiation of a wavelength of 250 to 750 nm. For this purpose, common lamps, such as carbon arc lamps, mercury lamps, xenon lamps and metal halide lamps, or lasers or laser diodes can be used. UV laser diodes emitting UV radiation in the range of about 405 nm (e.g. 405±10 nm), argon ion lasers emitting in the visible range (488 nm or 514 nm) and frequency-doubled fd:Nd:YAG lasers emitting at around 532 nm are of particular interest as a radiation source.

If the sensitizer absorbs IR radiation, i.e. noticeably absorbs radiation of a wavelength in the range of more than 750 to 1,200 nm, and preferably shows an absorption maximum in this range in its absorption spectrum, image-wise exposure can be carried out with IR radiation sources. Suitable radiation sources are e.g. semi-conductor lasers or laser diodes which emit in the range of 750 to 1200 nm, for example Nd:YAG lasers (1,064 nm), laser diodes which emit between 790 and 990 nm, and Ti:sapphire lasers. The laser radiation can be digitally controlled via a computer, i.e. it can be turned on or off so that an image-wise exposure of the plates can be effected via stored digitized information in the computer; this way, so-called computer-to-plate (ctp) printing plates can be obtained. Any image-setters equipped with IR lasers that are known to the person skilled in the art can be used.

Depending on whether the radiation-sensitive element is positive working or negative working, the irradiated areas or the non-irradiated areas, respectively, are subsequently removed with a developer (preferably an aqueous alkaline developer) so that printing image areas and non-printing background areas are obtained.

The developed elements are usually treated with a preservative ("gumming"). The preservatives are aqueous solutions of hydrophilic (co)polymers, wetting agents and other known additives.

For certain applications, it is furthermore advantageous to increase the mechanical strength of the obtained image areas by subjecting them to a heat treatment (what is referred as "baking") and/or overall exposure (e.g. to UV light). For this purpose, prior to the treatment, the imaged plate is treated with a solution that protects the non-image areas such that the heat treatment does not cause these areas to accept ink. A solution suitable for this purpose is e.g. described in U.S. Pat. No. 4,355,096. Baking usually takes place at a temperature in the range of 150 to 250° C. When both baking and overall exposure are carried out, the two treatment steps can be performed simultaneously or one after the other.

Elements according to the present invention are characterized by an improved resistance to chemicals; the developed printing plates show an excellent abrasion resistance which allows high numbers of copies to be printed.

Within the framework of the present invention, the terms "lithographic printing plate precursor", "precursor" and "radiation-sensitive element" also encompass an element/precursor wherein the substrate comprises a radiation-sensitive coating on both sides. However, a one-sided coating is preferred.

The present invention is described in more details in the following examples.

EXAMPLES

The following abbreviations are used:

DAA diacetone alcohol

BG butyl glycol

DMSO dimethylsulfoxide

TN13 novolak, partially tosylated

PD-140 m/p-cresol novolak with $M_w$=7,000

P-3000 2,1,5-naphthoquinone diazide

Trump Dye

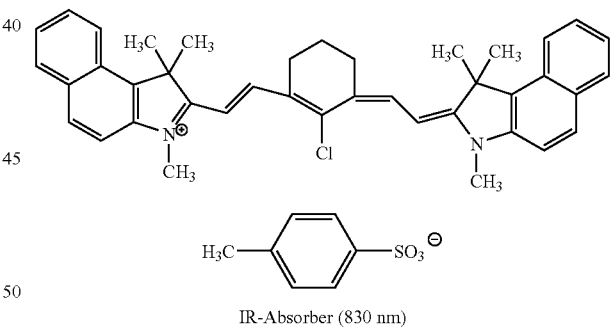

IR-Absorber (830 nm)

LB 6564 cresol/phenol novolak with $M_w$=7,000

PD 494 m/p-cresol novolak with $M_w$=9,000

Violet 612 triphenylmethane dye

M-NHND

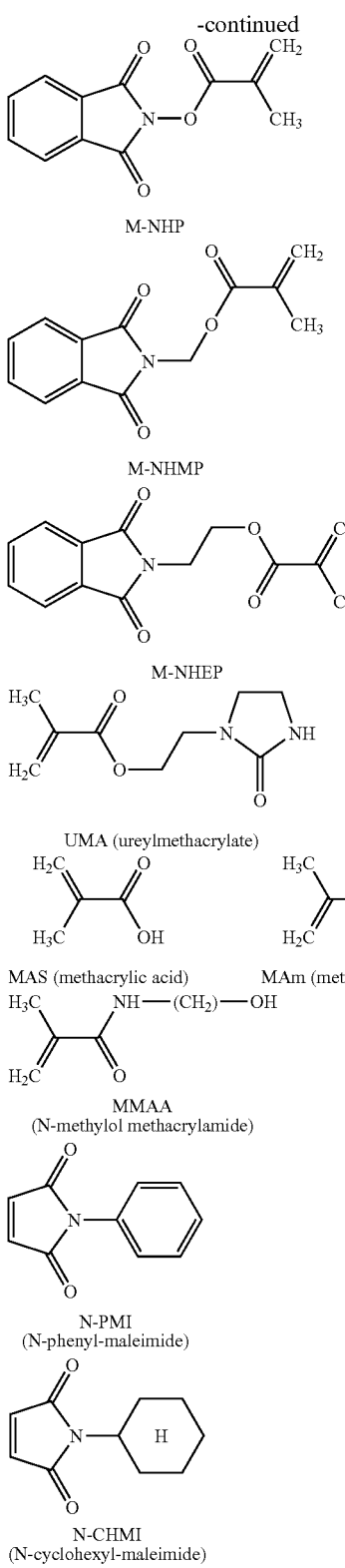

reprecipitation took place in triple the amount of methanol. The resulting copolymers were dried at 50° C. for 48 hours.

TABLE 1

|  | Methacrylic acid [wt.-%] | Imide | [wt.-%] Imide | Amide | [wt.-%] Amide |
|---|---|---|---|---|---|
| VP1 | 21 | PMI | 41.6 | MAm | 37.4 |
| VP2 | 15 | PMI | 50 | MAm | 35 |
| VP3 | 20 | PMI | 45 | MAm | 35 |
| P1 | 20 | M-NHND | 50 | MAm | 30 |
| P2 | 20 | M-NHP | 50 | MAm | 30 |
| P3 | 20 | M-NHMP | 50 | MAm | 30 |
| VP4 | 20 | M-NHEP | 50 | MAm | 30 |
| VP5 | 20 | PMI | 50 | UMA | 30 |
| P5 | 20 | M-NHND | 50 | UMA | 30 |
| P6 | 25 | M-NHND | 45 | UMA | 30 |
| P7 | 30 | M-NHND | 45 | UMA | 25 |
| P8 | 30 | M-NHND | 40 | UMA | 30 |
| P9 | 35 | M-NHND | 35 | UMA | 30 |
| P10 | 40 | M-NHND | 30 | UMA | 30 |
| P11 | 20 | M-NHP | 50 | UMA | 30 |
| P12 | 25 | M-NHP | 45 | UMA | 30 |
| P13 | 30 | M-NHP | 40 | UMA | 30 |
| P14 | 35 | M-NHP | 35 | UMA | 30 |
| P15 | 20 | M-NHMP | 50 | UMA | 30 |
| VP6 | 20 | M-NHEP | 50 | UMA | 30 |
| VP7 | 20 | PMI | 50 | MMAA | 30 |
| P17 | 20 | M-NHND | 50 | MMAA | 30 |
| P18 | 20 | M-NHP | 50 | MMAA | 30 |
| P19 | 25 | M-NHP | 45 | MMAA | 30 |
| P20 | 30 | M-NHP | 40 | MMAA | 30 |

Properties of the Copolymers

The resulting copolymers were examined for their chemical and mechanical properties.

A solution of the various copolymers in a suitable organic solvent (e.g. methylglycol) was applied to a grained and anodized aluminum substrate such that a dry layer weight of about 1.5 g/m² was obtained.

The resistance of the coating to diacetone alcohol/$H_2O$ (ratio: 80:20) and butylglycol/$H_2O$ (ratio: 80:20) was examined as follows:

The plate samples are subjected to the liquids in 30 s increments for up to 8 minutes. The attack on the surface of the coating is evaluated visually.

Furthermore, the abrasion resistance of the baked coating was examined:

The samples are treated for 15 minutes with an aqueous suspension containing an abrasive (25μ $Al_2O_3$ particles). Then the abrasion is determined gravimetrically and expressed as a percentage of the original layer weight.

The results of the tests described above can be inferred from Table 2.

Furthermore, the properties of the copolymers were examined when a coating prepared therefrom was baked for 8 minutes at 235° C.

Abrasion resistance was examined as described above.

Furthermore, the resistance of the coating to DMSO and to a commercial correction fluid (correction fluid 243 from Kodak Polychrome Graphics) was examined. The tests were carried out as follows:

The plate samples are subjected to the liquids in 30 s increments for up to 8 minutes. The attack on the surface of the coating is evaluated visually.

The results of the tests on baked coatings described above can also be inferred from Table 2.

Synthesis of Copolymers CP:

Copolymers were prepared from the monomers listed in Table 1. For polymerization, the monomers were placed in a flask equipped with a stirrer and a nitrogen inlet at 60° C. in methylglycol (total monomer concentration: 2.5 mole/l) and 0.1 mole-% azobisisobutyro-nitrile are added as initiator. The

TABLE 2

| Polymer | unbaked | | baked (235° C., 8 min) | | |
| --- | --- | --- | --- | --- | --- |
| | | | Correction | | |
| | DAA/H$_2$O | BG/H$_2$O | fluid 243 | DMSO | Loss due to abrasion |
| VP2 | 2-3 min | 4-5 min | <<1 min | <<1 min | 1.46 g/m$^2$ |
| VP3 | 2-3 min | 4-5 min | <<1 min | <<1 min | 1.42 g/m$^2$ |
| P1 | >>4 min | >>4 min | >>8 min | >>8 min | 0.71 g/m$^2$ |
| P2 | >>4 min | >>4 min | >>8 min | 2 min | 0.48 g/m$^2$ |
| P3 | >>4 min | >>4 min | 3-4 min | 1-2 min | 0.56 g/m$^2$ |
| VP4 | >>4 min | >>4 min | 3-4 min | 1-2 min | 0.96 g/m$^2$ |
| VP5 | 4 min | >>4 min | 1-2 min | <<1 min | 1.17 g/m$^2$ |
| P6 | >>4 min | >>4 min | >>8 min | >>8 min | 0.53 g/m$^2$ |
| P10 | >>4 min | >>4 min | >>8 min | >>8 min | 0.59 g/m$^2$ |
| P11 | 4 min | >>4 min | >>8 min | >>8 min | 0.61 g/m$^2$ |
| P14 | >>4 min | >>4 min | >>8 min | >>8 min | 0.63 g/m$^2$ |
| P15 | 3-4 min | >>4 min | >8 min | >8 min | 0.76 g/m$^2$ |
| VP6 | 2-3 min | >>4 min | 2-3 min | 1-2 min | 1.03 g/m$^2$ |
| VP7 | 0.5 min | 0.5 min | 2.3 min | 1-2 min | 1.14 g/m$^2$ |
| P17 | >>4 min | >>4 min | >>8 min | >>8 min | 0.90 g/m$^2$ |
| P18 | >>4 min | >>4 min | >>8 min | >>8 min | 0.50 g/m$^2$ |

Dual-Layer Printing Plate Precursor

Two layers as shown in Table 3 were applied onto an aluminum substrate as described above in order to test the copolymers of the present invention in dual-layer IR-sensitive printing plate precursors.

TABLE 3

| Bottom layer: |
| --- |
| 15% Trump Dye |
| 85% polymer |
| Top layer: |
| 69.50% PD-140 |
| 29.80% P-3000 |
| 0.7% ethyl violet |

At first, only the bottom layer was applied onto the aluminum substrate and its resistance was examined in an unbaked and a baked state. The results can be inferred from Table 4; the tests were carried out as described above.

TABLE 4

| Polymer | unbaked | | baked (235° C., 8 min) | | |
| --- | --- | --- | --- | --- | --- |
| | | | Correction | | |
| | DAA/H$_2$O | BG/H$_2$O | fluid 243 | DMSO | Loss due to abrasion |
| VP2 | 1-2 min | 2 min | <1 min | <1 min | 1.0 g/m$^2$ |
| VP3 | 1-2 min | 2 min | <1 min | <1 min | 1.1 g/m$^2$ |
| P1 | >4 min | >4 min | >8 min | 4 min | 0.64 g/m$^2$ |
| VP5 | 2 min | >4 min | 2-4 min | 1 min | 1.03 g/m$^2$ |
| P6 | 2 min | >4 min | >8 min | >8 min | 0.60 g/m$^2$ |
| P10 | 2 min | >4 min | >8 min | >8 min | 0.53 g/m$^2$ |
| P11 | 2 min | >4 min | >8 min | >8 min | 0.70 g/m$^2$ |
| P14 | 2 min | >4 min | >8 min | >8 min | 0.63 g/m$^2$ |
| P15 | 2-3 min | >4 min | >8 min | >8 min | 0.77 g/m$^2$ |
| VP6 | 1 min | >4 min | >8 min | >8 min | 0.91 g/m$^2$ |
| VP7 | <0.5 min | 1 min | 1-2 min | <0.5 min | 1.03 g/m$^2$ |
| P17 | >>4 min | >>4 min | >>8 min | >>8 min | 0.76 g/m$^2$ |
| P18 | <0.5 min | 2 min | >>8 min | >>8 min | 0.54 g/m$^2$ |

Furthermore, dual-layer precursors were prepared (see Table 3), imagewise exposed with a Creo image-setter (830 nm) and developed using the developer 956 from Kodak Polychrome Graphics. The energy necessary to obtain the same tonal values at 1×1, 2×2 and 4×4 screen points using a UGRA gray scale V 2.0 EPS (i.e. all screen points are of the same lightness or darkness) was measured. The optimal exposure energy values and the optical evaluation of the developed plates are given in Table 5.

TABLE 5

| Polymer in the bottom layer | optimal exposure energy | Comment |
| --- | --- | --- |
| VP1 | 150 mJ | plate well developed with clean background |
| P8 | 200 mJ | clean background |
| P13 | 200 mJ | clean background |
| VP7 | >250 mJ | slight residue in the background area |
| P10 | 150 | clean background |
| P14 | 150 | clean background |

Single-Layer Printing Plate Precursor

Single-layer IR-sensitive printing plate precursors were prepared from the compositions shown in Table 6 using the substrate described above.

TABLE 6

|  | Reference | Series A | Series B |
| --- | --- | --- | --- |
| LB6564 | 1.6250 g | 1.6250 g | 1.0375 g |
| PD494 | 0.5875 g | 0 | 0.5875 g |
| Polymer | 0 | 0.5875 g | 0.5875 g |
| Violet 612 | 0.0500 g | 0.0500 g | 0.0500 g |
| Trump Dye | 0.0375 g | 0.0375 g | 0.0375 g |

The resistance of the (unbaked) coating to Goldstar developer and an organic solvent (naphtha/isopropanol/water 79:20:1) was examined; the results can be inferred from Table 7.

TABLE 7

|  | Resistance to Goldstar | Solvent resistance |
| --- | --- | --- |
| Reference | 120 s | 0 min |
| P1-B | 120 s | 3-4 min |
| P6-A | 180 s | >>4 min |
| P11-B | 120 s | >>4 min |
| VP7-A | 90 s | 2-3 min |
| VP7-B | 180 s | 2-3 min |
| P17-A | >120 s | >>4 min |
| P17-B | >>180 s | >>4 min |

*) A and B refers to the series A and B, respectively, of Table 5; VP and P refer to the copolymer used (see Table 1)

Single-Layer Printing Plate Precursors with Copolymers CP as the Sole Binder

A coating with a dry layer weight of 1.7 g/m² containing 15 wt.-% Trump Dye and 85 wt.-% copolymer (see Table 8) was applied to an aluminum substrate as described above.

It was examined whether imageable printing plate precursors were obtained whose coating is rendered more soluble upon IR radiation. Table 8 shows when an attack of the coating (in unexposed areas) due to the Goldstar developer could be observed, and how much time was required to obtain a clean background during developing after exposure with 200 mJ; whenever the time difference between the developer resistance before and after exposure was too small, no image could be obtained.

TABLE 8

|  | Resistance to Goldstar developer | Time required for clean background [sec] | Exposure energy [Creo Trendsetter] |
| --- | --- | --- | --- |
| VP1 | <5 s | <5 s | no image obtained |
| VP3 | <5 s | <5 s | no image obtained |
| P5 | 120 s | 60 s | 200-300 mJ |
| P6 | 50 s | 40 s | 200 mJ |
| P12 | 40 s | 25 s | 200 mJ |

The invention claimed is:

1. A lithographic printing plate precursor comprising (a) a substrate with a hydrophilic surface; and (b) a single-layer or multi-layer radiation-sensitive coating comprising a radiation-sensitive component and a copolymer CP soluble or dispersible in aqueous alkaline solution and comprising the units A, B and C, wherein unit A has the following formula

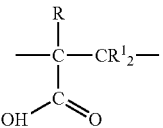
(A)

unit B has the following formula

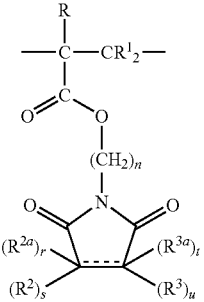
(B)

and unit C is at least one unit selected from

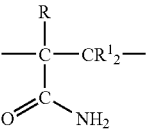
(C-1)

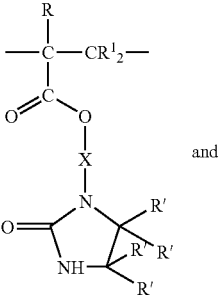
and
(C-2)

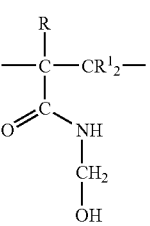
(C-3)

wherein each R and each $R^1$ is independently selected from hydrogen, alkyl, aryl, halogen and —CN, X is a spacer, each R' is independently selected from hydrogen, alkyl and aryl, n is 0 or 1 and $R^{2a}$, $R^2$, $R^{3a}$ and $R^3$ are independently selected from hydrogen and alkyl, or $R^2$ and $R^3$ or $R^{2a}$ and $R^{3a}$, together with the two C-atoms to which they are bonded, form an aryl group, a heteroaryl group or an unsaturated or saturated carbocyclic or heterocyclic group;

r, s, t and u are each 0 or 1, with the proviso that one of r and s is 0 if the C-atom to which $R^2$ and $R^{2a}$ are bonded is part of a C—C double bond, and with the proviso that one of t and u is 0 if the C-atom to which $R^3$ and $R^{3a}$ are bonded is part of a C—C double bond; and the dotted line indicates a double bond which may or may not be present, wherein the amount of unit A or, if different units A are present, their total amount, accounts for 5 to 60 wt. % based on the copolymer; and/or the amount of unit B or, if different units B are present, their total amount, accounts for 10 to 90 wt. %, based on the copolymer; and/or the amount of unit C or, if different units C are present, their total amount, accounts for 5 to 60 wt. %, based on the copolymer.

2. Precursor according to claim 1, wherein the radiation-sensitive coating is sensitive to the range of more than 750 to 1,200 nm of the electromagnetic spectrum.

3. Precursor according to claim 1, wherein the radiation-sensitive coating is sensitive to the range of 250 to 750 nm of the electromagnetic spectrum.

4. Precursor according to claim 1, wherein the precursor is a positive working precursor.

5. Precursor according to claim 1, wherein the precursor is a negative working precursor.

6. Precursor according to claim 5, further comprising an oxygen-impermeable overcoat layer on top of the radiation-sensitive coating.

7. Precursor according to claim 1, wherein the copolymer consists of units A, B and C.

8. Precursor according to claim 1, wherein unit A has the following formula

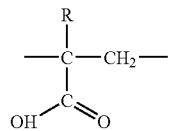

wherein R represents hydrogen or methyl; and/or unit B has the following formula

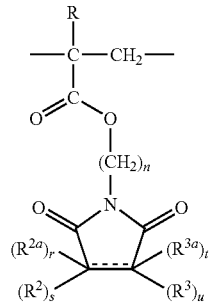

wherein R represents hydrogen or methyl and $R^2$, $R^{2a}$, $R^3$, $R^{3a}$, n, r, s, t and u are as defined in claim 1; and/or unit C is at least one unit selected from

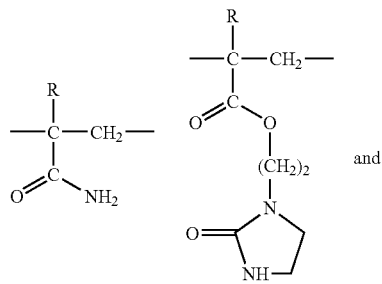

-continued

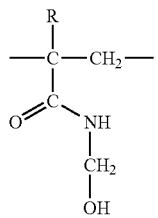

wherein R represents hydrogen or methyl.

9. Precursor according to claim 8, wherein unit A is derived from methacrylic acid; and/or
unit B is derived from one or more of the following monomers:

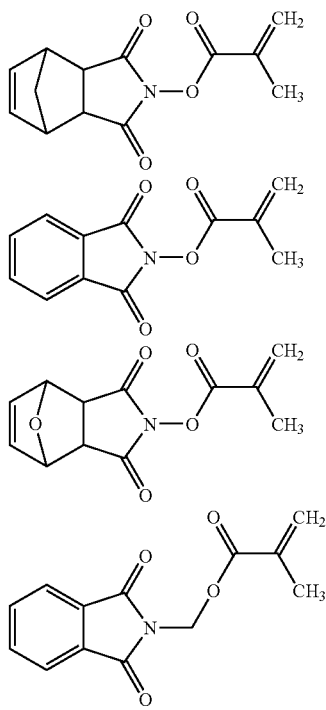

and/or
unit C is derived from one or more of the following monomers:

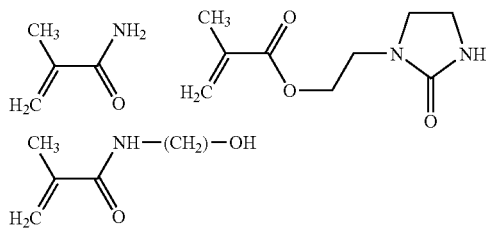

10. Precursor according to claim 2, wherein in addition to the copolymer the coating comprises: at least one novolak resin, at least one IR absorber and at least one component which decreases the aqueous alkaline developer solubility of novolak whereby this decrease in solubility is reversed by the application of heat, wherein the at least one IR absorber and the at least one component which decreases the solubility of novolak are the same or different compounds.

11. Precursor according to claim 2, wherein the coating comprises a bottom layer and a top layer, wherein the bottom layer comprises the copolymer and the top layer comprises (i) a novolak resin soluble in aqueous alkaline developer and a component which decreases the aqueous alkaline developer solubility of novolak, or (ii) a novolak chemically modified so that it is insoluble in, not dispersible in and not penetrable by an aqueous alkaline developer; and an IR absorber is present in the bottom layer or in the top layer or in both.

12. Precursor according to claim 1, wherein the radiation-sensitive coating is photopolymerizable and, in addition to the copolymer, comprises:
(a) an absorber component selected from photoinitiators and sensitizer/coinitiator systems which either absorbs radiation in the range of 250 to 750 nm or radiation in the range of more than 750 nm to 1,200 nm and initiates free-radical polymerization, and
(b) a free-radical polymerizable monomer, oligomer or prepolymer, or a mixture of 2 or more thereof.

13. Precursor according to claim 2, wherein in addition to the copolymer the radiation-sensitive coating comprises:
(a) at least one compound which forms an acid when subjected to IR radiation and
(b) at least one component cross-linkable by an acid.

14. Precursor according to claim 2, wherein the coating comprises an IR absorber and the copolymer is the only polymer in the coating.

15. Precursor according to claim 3, wherein in addition to the copolymer the radiation-sensitive coating comprises a diazonium polycondensation product.

16. Precursor according to claim 3, wherein in addition to the copolymer the radiation-sensitive coating comprises one or more novolaks and one or more quinone diazides.

* * * * *